(12) United States Patent
Lee et al.

(10) Patent No.: US 9,053,822 B2
(45) Date of Patent: Jun. 9, 2015

(54) METHODS OF OPERATING NONVOLATILE MEMORY DEVICES THAT SUPPORT EFFICIENT ERROR DETECTION

(71) Applicants: Ji-Sang Lee, Iksan-si (KR); Moosung Kim, Yongin-si (KR); Kihwan Choi, Seongnam-si (KR)

(72) Inventors: Ji-Sang Lee, Iksan-si (KR); Moosung Kim, Yongin-si (KR); Kihwan Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 174 days.

(21) Appl. No.: 13/777,512

(22) Filed: Feb. 26, 2013

(65) Prior Publication Data

US 2013/0322171 A1    Dec. 5, 2013

(30) Foreign Application Priority Data

May 29, 2012    (KR) ........................ 10-2012-0056641

(51) Int. Cl.
| | | |
|---|---|---|
| G11C 29/00 | (2006.01) | |
| G11C 29/04 | (2006.01) | |
| G11C 16/02 | (2006.01) | |
| G11C 16/04 | (2006.01) | |
| G11C 16/34 | (2006.01) | |
| G06F 11/10 | (2006.01) | |
| G11C 11/56 | (2006.01) | |

(52) U.S. Cl.
CPC ............... *G11C 29/04* (2013.01); *G11C 16/02* (2013.01); *G11C 11/5642* (2013.01); *G11C 16/0483* (2013.01); *G11C 16/3454* (2013.01); *G11C 2029/0411* (2013.01); *G06F 11/1048* (2013.01); *G11C 11/5628* (2013.01); *G11C 2211/5621* (2013.01)

(58) Field of Classification Search
CPC ................................ G06F 11/10; G11C 16/00
USPC ........................................... 714/766, 772, 773
See application file for complete search history.

(56) References Cited

U.S. PATENT DOCUMENTS

| | | |
|---|---|---|
| 7,324,382 B2 | 1/2008 | Kuo |
| 7,508,721 B2 | 3/2009 | Li et al. |
| 7,692,970 B2 | 4/2010 | Park et al. |
| 7,802,054 B2 | 9/2010 | Park et al. |
| 7,911,836 B2 | 3/2011 | Zilberman |
| 7,945,825 B2 | 5/2011 | Cohen et al. |
| 8,027,194 B2 | 9/2011 | Lee et al. |
| 8,050,101 B2 | 11/2011 | Park et al. |
| 8,068,361 B2 | 11/2011 | Kang et al. |
| 8,122,193 B2 | 2/2012 | Song et al. |
| 2006/0126394 A1 | 6/2006 | Li |

(Continued)

*Primary Examiner* — M. Mujtaba K Chaudry
(74) *Attorney, Agent, or Firm* — Myers Bigel Sibley & Sajovec, PA

(57) ABSTRACT

Methods of operating nonvolatile memory devices may include identifying one or more multi-bit nonvolatile memory cells in a nonvolatile memory device that have undergone unintentional programming from an erased state to an at least partially programmed state. Errors generated during an operation to program a first plurality of multi-bit nonvolatile memory cells may be detected by performing a plurality of reading operations to generate error detection data and then decoding the error detection data to identify specific cells having errors. A programmed first plurality of multi-bit nonvolatile memory cells and a force-bit data vector, which was modified during the program operation, may be read to support error detection. This data, along with data read from a page buffer associated with the first plurality of multi-bit nonvolatile memory cells, may then be decoded to identify which of the first plurality of multi-bit nonvolatile memory cells are unintentionally programmed cells.

21 Claims, 34 Drawing Sheets

(56) References Cited

U.S. PATENT DOCUMENTS

| | | |
|---|---|---|
| 2007/0106836 A1 | 5/2007 | Lee et al. |
| 2008/0158990 A1 | 7/2008 | Wan et al. |
| 2008/0316819 A1* | 12/2008 | Lee .................. 365/185.03 |
| 2009/0003058 A1* | 1/2009 | Kang ................. 365/185.03 |
| 2010/0008149 A1 | 1/2010 | Kim et al. |
| 2010/0010040 A1 | 1/2010 | Jones et al. |
| 2010/0062715 A1 | 3/2010 | Kim et al. |
| 2010/0082890 A1 | 4/2010 | Heo et al. |
| 2010/0142283 A1 | 6/2010 | Ha |
| 2010/0172185 A1 | 7/2010 | Kim |
| 2010/0199081 A1 | 8/2010 | Lee et al. |
| 2010/0309237 A1 | 12/2010 | Roh |
| 2010/0315325 A1 | 12/2010 | Hwang |
| 2011/0051514 A1 | 3/2011 | Han et al. |
| 2011/0099438 A1 | 4/2011 | Gonzalez et al. |
| 2011/0110154 A1 | 5/2011 | Kim et al. |
| 2011/0292724 A1* | 12/2011 | Kim .................. 365/185.03 |
| 2012/0163091 A1* | 6/2012 | Shibata et al. ........ 365/185.18 |
| 2013/0070526 A1* | 3/2013 | Eun et al. ............ 365/185.03 |
| 2013/0117620 A1* | 5/2013 | Joo et al. ................ 714/746 |

\* cited by examiner

Fig. 4

| Target | Initial PGM | | Final PGM | | SL:Read Data for Recovery | PGM Fail Bit Determination | Data Recovery |
|---|---|---|---|---|---|---|---|
| | DL1~DLk | AL:RRB | DL1~DLk | | | | |
| S2 | S2 Data | 0 | Pass Pattern | S2 Data Maintain | None | None | |
| | | | | | | Lower Tail Fail Bit:A,B | Original TD S2 Data |

Fig. 6

| Target | Initial PGM | AL:RRB | Final PGM | SL:Read Data for Recovery | Read Fail Bit Determination | Data Recovery |
|---|---|---|---|---|---|---|
| | DL1~DLk | | DL1~DLk | | | |
| S1 | S1 Data | 1 | Pass Pattern | On-Cell | None: C | Read: S1 Data |
| | | | | Off-Cell | Upper Tail Fail Bit: D | Read + RRB: S1 Data |

Fig. 8

| Target | Initial PGM | AL:RRB | Final PGM | SL:Read Data for Recovery | PGM Fail Bit Determination | Read Fail Bit Determination | Data Recovery |
|---|---|---|---|---|---|---|---|
| | DL1~DLk | | DL1~DLk | | | | |
| S1 | S1 Data | 1 | Pass Pattern | On-Cell | None | None: C | Read: S1 Data |
| | | | | Off-Cell | None | Upper Tail Fail Bit: D | Read + RRB: S1 Data |
| S2 | S2 Data | 0 | Pass Pattern | None | Lower Tail Fail Bit: A,B | None | None |
| | | | S2 Data Maintain | | | | Original TD S2 Data |

Fig. 14
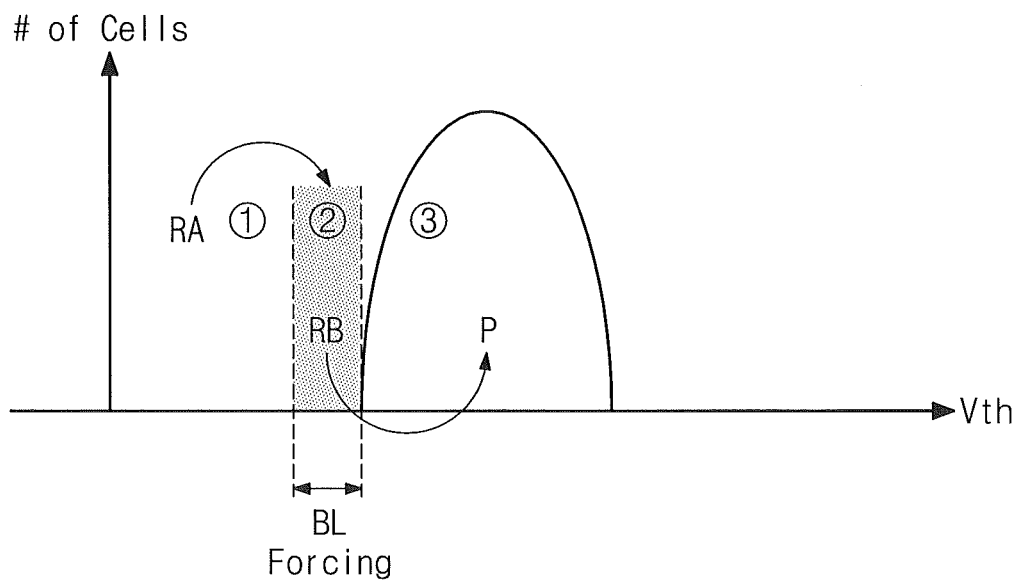
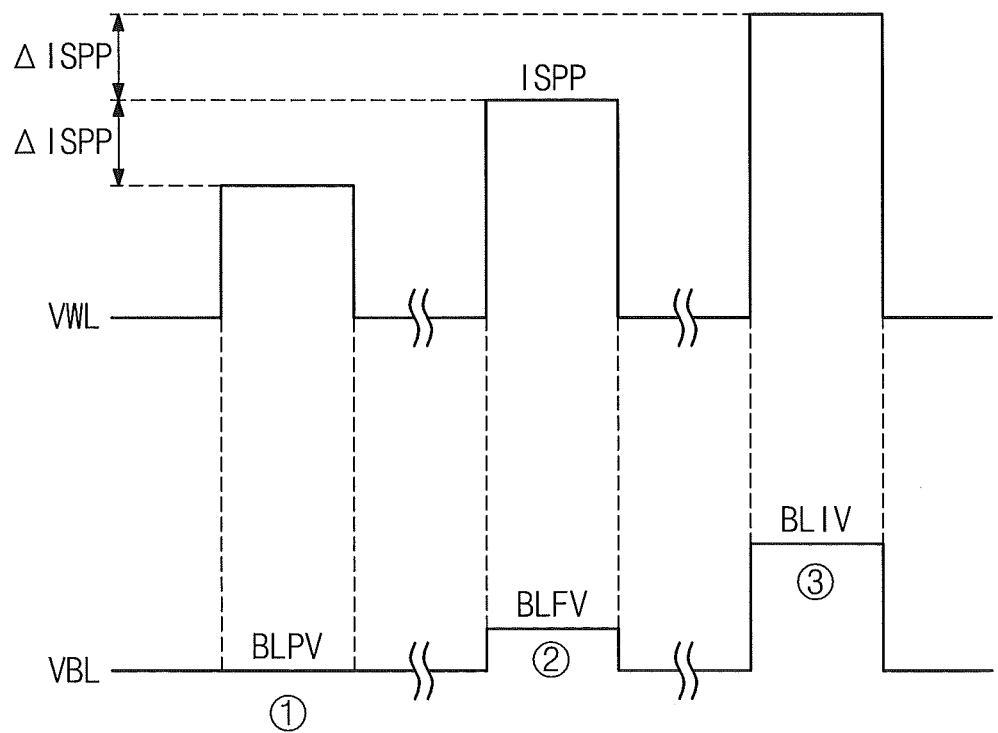

Fig. 16

Initial 2nd Page PGM

| State | ML | LL | FL |
|---|---|---|---|
| E | 1 | 1 | 1 |
| P1 | 0 | 1 | 1 |
| P2 | 0 | 0 | 1 |
| P3 | 1 | 0 | 1 |

⇓ PGM

Final 2nd Page PGM

| State | ML | LL | FL |
|---|---|---|---|
| E/Inhibit | 1 | 1 | 1 |
| P1 | 0→1 | 1 | 1→0 |
| P2 | 0→1 | 0→1 | 1→0 |
| P3 | 1 | 0→1 | 1→0 |

US 9,053,822 B2

METHODS OF OPERATING NONVOLATILE MEMORY DEVICES THAT SUPPORT EFFICIENT ERROR DETECTION

REFERENCE TO PRIORITY APPLICATION

A claim for priority under 35 U.S.C. §119 is made to Korean Patent Application No. 10-2012-0056641, filed May 29, 2012 in the Korean Intellectual Property Office, the entire contents of which are hereby incorporated by reference.

FIELD

This invention relates to memory devices and methods of operating same and, more particularly, to nonvolatile memory devices and methods of operating same.

BACKGROUND

Semiconductor memory devices may be volatile or nonvolatile. A nonvolatile semiconductor memory device may retain data stored therein even at power-off. The nonvolatile memory device may be permanent or reprogrammable, depending upon the fabrication technology used. The nonvolatile memory device may be used for user data, program, and microcode storage in a wide variety of applications in the computer, avionics, telecommunications, and consumer electronics industries.

SUMMARY

Methods of operating nonvolatile memory devices utilize multiple aspects of program operations to assist in post-program error detection in multi-bit nonvolatile memory cells. These error detection operations may include identifying one or more multi-bit nonvolatile memory cells in a memory device that have undergone unintentional programming from an erased state to an at least partially programmed state.

According to some embodiments of the invention, errors generated during an operation to program a first plurality of multi-bit nonvolatile memory cells in a nonvolatile memory device may be detected by performing a plurality of reading operations to generate error detection data and then decoding the error detection data to identify specific cells having errors therein. For example, a programmed first plurality of multi-bit nonvolatile memory cells and a force-bit data vector, which was modified during the program operation, may be read to support error detection. This read information along with data read from a page buffer associated with the first plurality of multi-bit nonvolatile memory cells may then be decoded to identify which of the first plurality of multi-bit nonvolatile memory cells are erased cells having unacceptably high threshold voltages.

To further support error detection, the program operations may include modifying an initial force-bit data vector having equivalent first data values (e.g., all "1s") into a modified force-bit data vector having a plurality of second data values therein, which identify respective ones of the first plurality of multi-bit nonvolatile memory cells that have undergone at least partial programming during the program operation. Operations may also be performed to update data in the page buffer in response to successful programming of one or more of the first plurality of multi-bit nonvolatile memory cells during the program operation.

According to additional embodiments of the invention, a method of operating a nonvolatile memory device may include detecting errors generated during an operation to program a page of multi-bit nonvolatile memory cells in the nonvolatile memory device by evaluating (e.g., decoding): (i) data read from the programmed page of multi-bit nonvolatile memory cells, (ii) a force-bit data vector modified during the program operation and (iii) data in a page buffer associated with the page of multi-bit nonvolatile memory cells. This evaluation is performed to identify whether any of the multi-bit nonvolatile memory cells in the page are erased cells having unacceptably high threshold voltages (i.e., unintentionally "programmed" cells). To support these error detection operations, the program operations may include modifying an initial force-bit data vector having equivalent first data values therein into a modified force-bit data vector having a plurality of second data values therein. These second data values identify a respective plurality of the multi-bit nonvolatile memory cells in the page as having undergone at least partial programming during the program operation. The program operations may also include resetting at least some of the data in the page buffer to default values in response to successful programming of one or more of the multi-bit nonvolatile memory cells in the page during the program operation.

According to still further embodiments of the invention, a method of operating a nonvolatile memory device includes changing a first multi-bit data value associated with a first program state of a first multi-bit nonvolatile memory cell in the nonvolatile memory device to a second multi-bit data value associated with an erased state of the first multi-bit nonvolatile memory cell. This data value change operation is performed in response to verifying that the first multi-bit nonvolatile memory cell has been validity programmed into the first program state during a program operation. Force-bit data modified during the program operation is then read to confirm that the second multi-bit data value associated with the first multi-bit nonvolatile memory cell reflects an accurately programmed cell. The program operation may also include resetting the first multi-bit data value to the second multi-bit data value in a page buffer. Moreover, the step of reading the modified force-bit data may include reading the page buffer, the force-bit data modified during the program operation and a plurality of multi-bit nonvolatile memory cells in the nonvolatile memory device and then using this read information to identify erased cells in the plurality of multi-bit nonvolatile memory cells that have unacceptably high threshold voltages. The step of reading the modified force-bit data may be preceded by an operation to load a multi-bit force-bit vector of equivalent logic values into a force-bit register. In addition, the operation to modify at least a portion of the multi-bit force-bit vector in the force-bit register during the program operation may be performed to identify a plurality of multi-bit nonvolatile memory cells in the nonvolatile memory device that have undergone intentional programming using an ISSP programming technique.

According to still further embodiments of the invention, a method of operating a nonvolatile memory device can include performing an error detection operation on a row of multi-bit nonvolatile memory cells in the nonvolatile memory device by reading the row of multi-bit nonvolatile memory cells along with reading post-program data from a page buffer and force-bit data used during programming of the row of multi-bit nonvolatile memory cells. These operations are performed to identify whether any of the multi-bit nonvolatile memory cells in the row are erased cells having unacceptably high threshold voltages. This performing can be preceded by loading the page buffer with a plurality of pages of data and then programming the row of multi-bit nonvolatile memory cells with the plurality of pages of data from the page buffer. This programming the row of multi-bit nonvolatile memory cells may include resetting at least some of the data in the page buffer as corresponding program states of multi-bit nonvolatile memory cells in the row are verified as accurate. The programming the row of multi-bit nonvolatile memory cells may also include modifying bits of a pre-loaded force-bit vector to thereby indicate the performance of ISSP program operations on corresponding multi-bit nonvolatile memory cells within the row.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 is a diagram illustrating data states of latches of a page buffer at a lower tail data recovery operation in FIG. 3.

FIG. 6 is a diagram illustrating data states of latches of a page buffer at an upper tail data recovery operation in FIG. 5.

FIG. 8 is a diagram illustrating data states of latches of a page buffer at a data recovery operation in FIG. 7.

FIG. 14 is a diagram for describing bit line forcing according to an embodiment of the inventive concept.

FIG. 16 is a diagram illustrating a variation in data of latches of a page buffer in FIG. 13 at a program operation.

DETAILED DESCRIPTION

Figure 1:
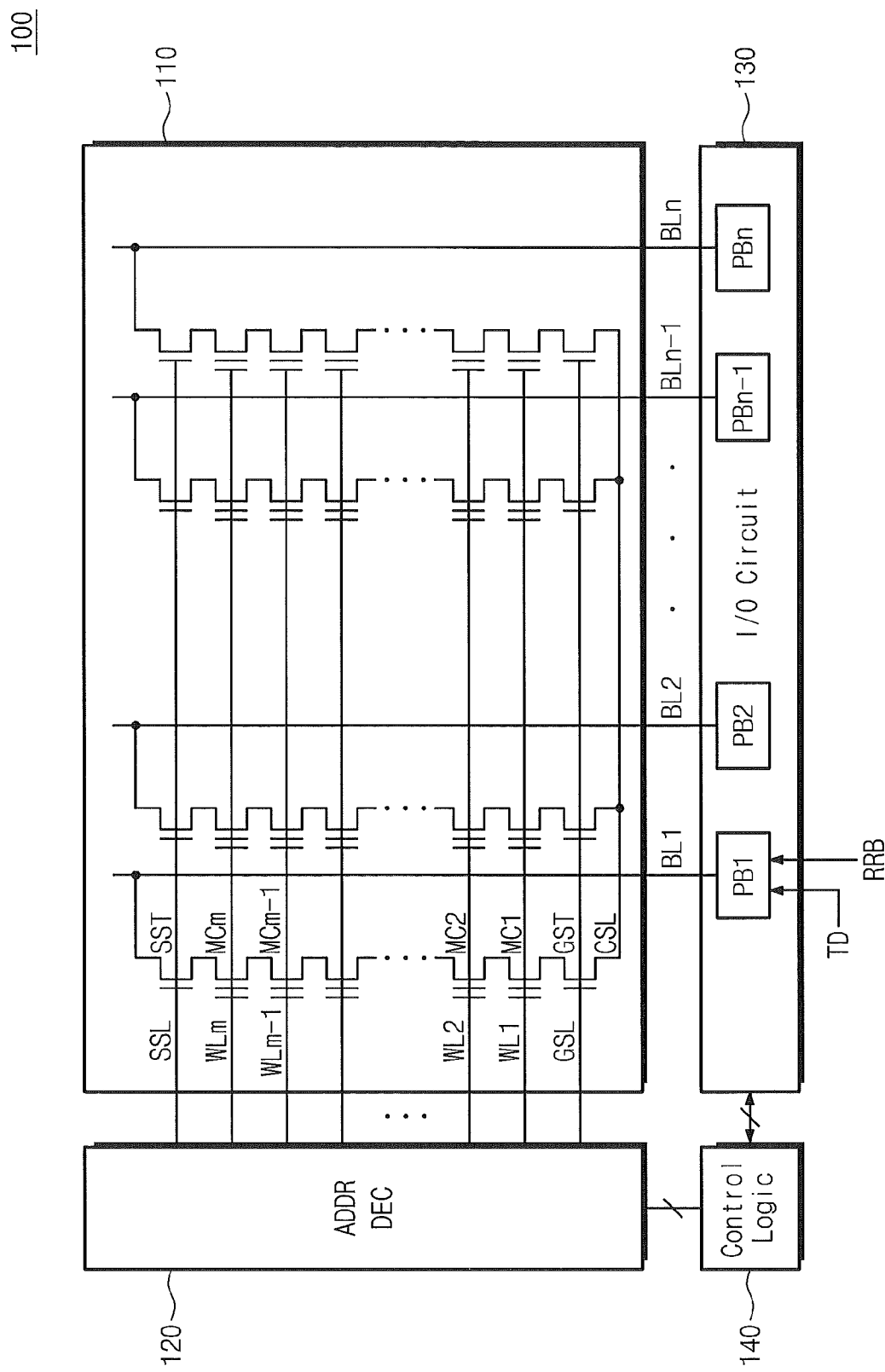
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the scope of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different Orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device according to an embodiment of the inventive concept. Referring to FIG. 1, a nonvolatile memory device 100 may include a memory cell array 110, an address decoder 120, an input/output circuit 130, and control logic 140. The nonvolatile memory device 100 may be a NAND flash memory device, for example. However, it is well understood that the nonvolatile memory device 100 is not limited to the NAND flash memory device. For example, the inventive concept may be applied to a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, a Spin Transfer Torque Random Access Memory (STT-RAM), and the like. Further, the nonvolatile memory device can be implemented to have a three-dimensional array structure. A nonvolatile memory device with the three-dimensional array structure may be referred to as a vertical NAND flash memory device. The inventive concept may be applied to a Charge Trap Flash (CTF) memory device including a charge storage layer formed of an insulation film as well as a flash memory device including a charge storage layer formed of a conductive floating gate. Below, the inventive concept will be described under the condition that the nonvolatile memory device 100 is a NAND flash memory device.

The memory cell array 110 may include a plurality of memory blocks. For ease of description, one memory block may be illustrated in FIG. 1. The memory block may include strings connected with bit lines BL1 to BLn (n being a natural number), respectively. Herein, each string may include a string selection transistor SST, memory cells MC1 to MCm (m being a natural number), and a ground selection transistor GST. In each string, the string selection transistor SST may be driven by a voltage transferred via a string selection line SSL, and the ground selection transistor GST may be driven by a voltage transferred via a ground selection line GSL. Each of the memory cells MC1 to MCm may store at least one bit of data and be driven by a voltage transferred via a corresponding one of word lines WL1 to WLm. The address decoder 120 may select one of the plurality of memory blocks in response to an address, and may transfer the word lines WL1 to WLm with word line voltages for driving (e.g., a program voltage, a pass voltage, an erase voltage, a verification voltage, a read voltage, a read pass voltage, etc.).

During a program operation, the input/output circuit 130 may temporarily store data input from an external device to load it onto a page to be written. During a read operation, the input/output circuit 130 may read data from a page to be read to output it to the external device. The input/output circuit 130 may include page buffers PB1 to PBn corresponding to the bit lines BL1 to BLn, respectively. Each of the page buffers PB1 to PBn may include a plurality of latches for program and read operations. In each page buffer, at least one of the plurality of latches may store target data TD for a program operation, and the target data TD may be changed into data of a pass pattern when a program operation of a corresponding memory cell (hereinafter, referred to as a cell program operation) is passed. One of the plurality of latches may store/establish a recovery reference bit RRB. Herein, the recovery reference bit RRB may be a bit used to support a data recovery operation, and may include information indicating a specific state (e.g., an erase state) to be recovered.

The control logic 140 may control an overall operation of the nonvolatile memory device 100. The control logic 140 may decode control signals and commands provided from an external memory controller, and may control the address decoder 120 and the input/output circuit 130 according to a decoded result. The control logic 140 may control a voltage generating circuit to generate voltages needed for driving (e.g., programming, reading, erasing, etc.) the address decoder 120 to transfer the voltages to the word lines WL1 to WLm, and the input/output circuit 130 for input/output of page data to be programmed and page data read. During a data recovery operation, the control logic 140 may perform a read operation on programmed memory cells at least once in response to a data recovery command. The control logic 140 may recover target data TD input during a program operation using data read according to the read operation and a recovery reference bit RRB. Herein, the data recovery command may be provided from the external memory controller. A conventional nonvolatile memory device may store target data at a separate storage space for a data recovery operation during a program operation. For example, during a program operation, target data may be stored in a page buffer of a nonvolatile memory device or at a buffer of the external memory controller. During a conventional data recovery operation, a program operation may be executed at another physical page using the target data thus stored. The above-described program operation may require a separate storage space for storing target data for a data recovery operation.

On the other hand, the nonvolatile memory device 100 of the inventive concept may recover target data using a read operation and a recovery reference bit RRB during a data recovery operation. That is, the nonvolatile memory device 100 of the inventive concept may not require a separate storage space for target data TD for a data recovery operation. Thus, it is possible to reduce a chip size using the nonvolatile memory device 100 of the inventive concept.

Figure 2:
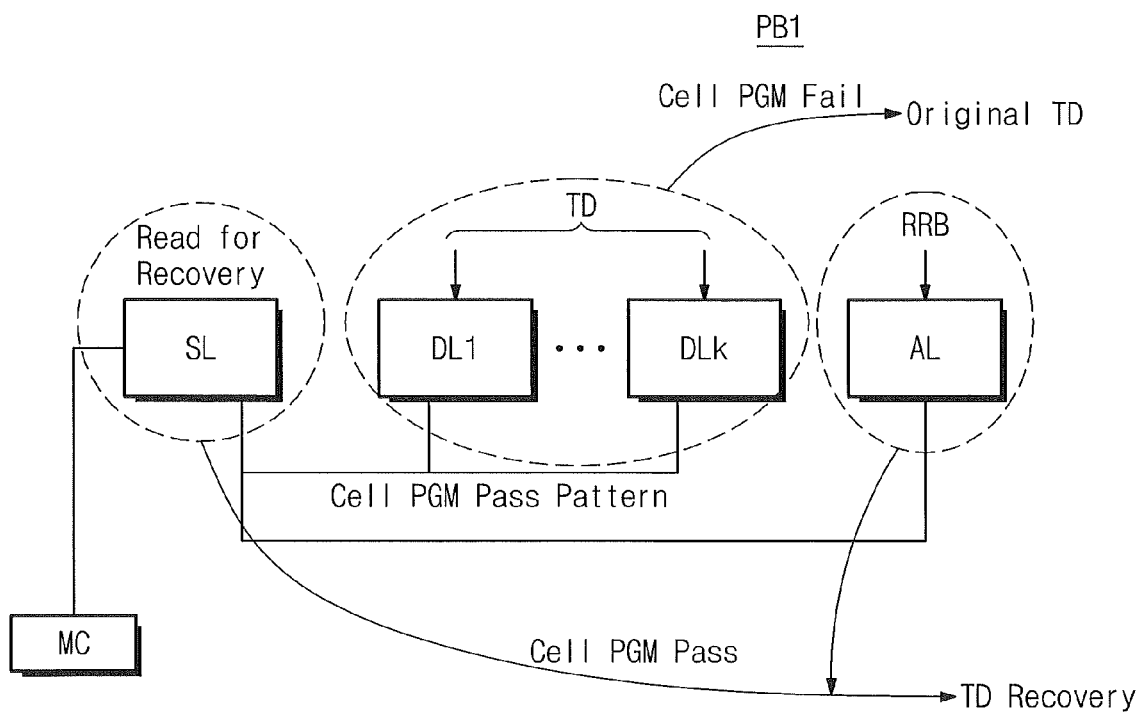
FIG. 2 is a block diagram schematically illustrating a page buffer in FIG. 1 according to an embodiment of the inventive concept.

FIG. 2 is a block diagram schematically illustrating a page buffer in FIG. 1 according to an embodiment of the inventive concept. Referring to FIG. 2, a page buffer PB1 may include a sense latch SL, data latches DL1 to DLk (k being an integer) (hereinafter, referred to as at least one first latch), and an additional latch AL (hereinafter, referred to as a second latch). The sense latch SL may store data indicating whether a memory cell is an on-cell or an off-cell during a program/program verification/read operation. For example, during a program verification/read operation, the sense latch SL may store data indicating an on-cell when a threshold voltage of a memory cell is lower than a reference level and data indicating an off-cell when a threshold voltage of a memory cell is higher than the reference level. During a data recovery operation, the sense latch SL may store a result of a read operation for recovering target data TD, that is, read data. The data latches DL1 to DLk may store target data TD indicating a program state at a program operation. Data of the data latches DL1 to DLk may be changed into pass pattern data when a cell program operation is passed. Herein, the pass pattern data may be data corresponding to an erase state of a memory cell.

The additional latch AL may store a recovery reference bit RRB at a program operation. Herein, the recovery reference bit RRB may be information associated with a specific state for recovering a fail bit. The specific state may be a state previously determined by a user. For example, in the event a user knows that fail bits on an erase state are many, the additional latch AL may store a recovery reference bit RRB for recovering a fail bit of an erase state. That is, if a recovery on a fail bit of an erase state is required during a data recovery operation, the recovery reference bit RRB may be a bit indicating whether target data TD input to the page buffer PB1 corresponds to an erase state. However, a user does not have to determine a specific state. The nonvolatile memory device 100 may determine a program state that a fail bit is frequently generated, and may determine the judged program state as a specific state. One page buffer PB1 may be illustrated in FIG. 2. However, the remaining page buffers PB2 to PBn may be configured substantially the same as illustrated in FIG. 2.

A data recovery operation executed at a page buffer PB1 according to the inventive concept may be divided into a first data recovery operation and a second data recovery operation. With the first data recovery operation, when a cell program operation is failed, data stored at the data latches DL1 to DLk may be output as original target data. With the second data recovery operation, when a cell program operation is passed, target data TD may be recovered using a read operation for recovering data and a recovery reference bit RRB. The page buffer PB1 of the inventive concept may be configured to recover target data TD using data stored at the data latches DL1 to DLk, a result of a read operation for data recovery, and a recovery reference bit RRB. An operation of recovering target data TD will be more fully described later.

Figure 3:
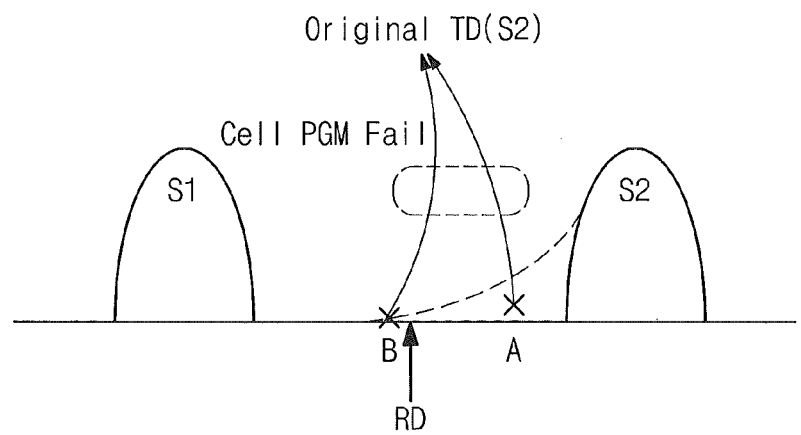
FIG. 3 is a diagram illustrating a lower tail data recovery method when a cell program operation is failed.

FIG. 3 is a diagram illustrating a lower tail data recovery method when a cell program operation has failed. Herein, a lower tail may not reach a target state (e.g., S2) as memory cells placed at A and B in FIG. 3. For example, in the event that a memory cell is a "slow" cell, it may not reach a second state S2 although a current program loop reaches a maximum program loop. A memory cell placed at A may have a threshold voltage higher than a read level RD, and a memory cell placed at B may have a threshold voltage lower than the read level RD. Herein, the read level RD may be a level for a data recovery operation. A memory cell placed at A or B does not necessitate a read operation for data recovery. The reason may be that data latches DL1 to DLK (refer to FIG. 2) corresponding to a memory cell placed at A or B store data indicating a fail state of a cell program operation. That is, data latches DL1 to DLK (refer to FIG. 2) corresponding to a memory cell placed at A or B may retain target data TD corresponding to the second state S2 that was previously loaded. Thus, a memory cell placed at A or B may be judged to be a lower tail fail bit, and data stored at the data latches DL1 to DLk may be recovered as original target data during a data recovery operation.

FIG. 4 is a diagram illustrating data states of latches of a page buffer at duing lower tail data recovery operation in FIG. 3. Below, data states of latches at a lower tail data recovery operation will be described with reference to FIGS. 2, 3, and 4. For ease of description, it is assumed that a target state is a second state S2. When a target state is a second state S2, at a program operation, data latches DL1 to DLk may receive data corresponding to the second state S2, and an additional latch AL may store a value of 0. The data latches DL1 to DLk corresponding to the second state S2 may store data according to whether a cell program operation is passed or failed, respectively. If data of the data latches DL1 to DLk has a pass pattern indicating that a cell program operation is passed, a lower tail data recovery operation may not be required. One the other hand, when data of the data latches DL1 to DLk does not have a pass pattern indicating that a cell program operation is passed, that is, when data of the data latches DL1 to DLk keeps data corresponding to the second state S2, a memory cell placed at A or B may be judged to be a lower tail fail bit. Thus, data S2 maintained at the data latches DL1 to DLk may be recovered as the original target data. With the above-described lower tail data recovery operation, when data of the data latches DL1 to DLk is not a pass pattern indicating a passed cell program operation, it may be recovered as the original target data.

Figure 5:
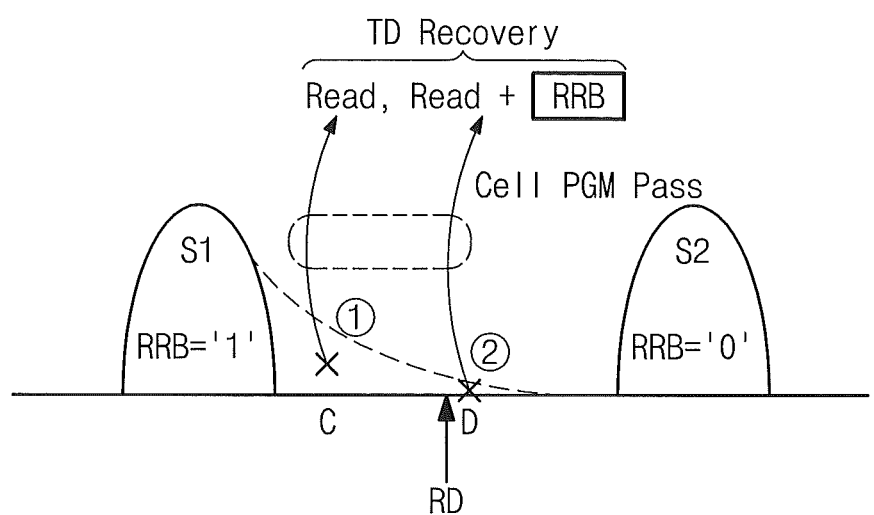
FIG. 5 is a diagram illustrating an upper tail data recovery method when a cell program operation is passed.

FIG. 5 is a diagram illustrating an upper tail data recovery method when a cell program operation is passed. Herein, an upper tail may indicate passed memory cells which are over programmed due to program disturbance (e.g., coupling) or read disturbance. An upper tail data recovery operation may be divided into a first upper tail data recovery operation (①), which is executed during a read operation for data recovery, and a second upper tail data recovery operation (②), which is executed using a read operation and a recovery reference bit RRB, according to a judgment result of an upper tail fail bit. Herein, judgment of an upper tail fail bit may be made according to a read operation on a memory cell which has passed the cell program operation. For example, a memory cell placed at C (judged to be an on-cell according a result of a read operation) may not be judged to be an upper tail fail bit. A memory cell placed at D (judged to be an off-cell) may be judged to be an upper tail fail bit. A recovery reference bit RRB may be a value associated with upper tail data recovery of a first state S1. '1' may correspond to the first state S1, and '0' may correspond to the second state S2. With the first upper tail data recovery operation, in the event that a result of a read operation for data recovery indicates an on-cell (e.g., a memory cell placed at C), data corresponding to the first state S1 may be recovered as target data TD. With the second upper tail data recovery operation, in the event that a result of a read operation for data recovery indicates an off-cell (e.g., a memory cell placed at D), data corresponding to the first state may be recovered as target data based on a value (e.g., '1') of a recovery reference bit RRB.

FIG. 6 is a diagram illustrating data states of latches of a page buffer at an upper tail data recovery operation in FIG. 5. Below, data states of latches during an upper tail data recovery operation will be described with reference to FIGS. 2, 5, and 6. For ease of description, it is assumed that a target state is a first state S1. When a target state is a first state S1, at a program operation, data latches DL1 to DLk may receive data corresponding to the first state S1, and an additional latch AL may store a value of 1. For ease of description, it is assumed that a cell program operation of a memory cell corresponding to the first state S1 is passed. In this case, data of the data latches DL1 to DLk corresponding to the first state S1 may be changed into a pass pattern indicating that a cell program operation is passed. If a sense latch SL stores data corresponding to an on-cell as a result of a read operation for data recovery at an upper tail recovery operation of the first state S1, data corresponding to the first state S1 may be recovered as target data TD based on read data. However, a memory cell placed at C may not be judged to be an upper tail fail bit. If a sense latch SL stores data corresponding to an off-cell as a result of a read operation for data recovery at an upper tail recovery operation of the first state S1, a memory cell placed at D may be judged to be an upper tail fail bit of the first state S1 using read data and a recovery reference bit RRB of '1' stored at the additional latch AL, and data S1 corresponding to the first state S1 may be recovered to target data TD. In brief, with the above-described upper tail data recovery operation, when data of data latches DL1 to DLk is a pass pattern indicating a passed cell program operation, target data TD may be recovered using a read operation for data recovery and a recovery reference bit RRB. A lower tail data recovery method may be described with reference to FIGS. 3 and 4, and an upper tail data recovery method may be described with reference to FIGS. 5 and 6. Meanwhile, it is possible to recover target data TD regardless of whether a cell program operation is passed or failed.

Figure 7:
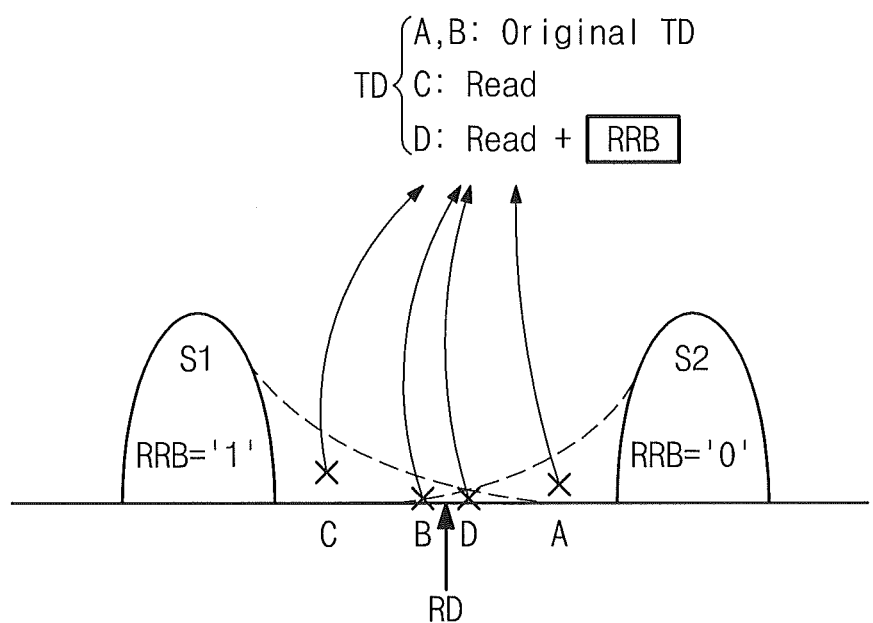
FIG. 7 is a diagram illustrating a data recovery method according to an embodiment of the inventive concept.

FIG. 7 is a diagram illustrating a data recovery method according to an embodiment of the inventive concept. Referring to FIG. 7, a data recovery method may be a combination of a lower tail data recovery method of a second state S2 in FIG. 3 and an upper tail data recovery method of a first state S1 in FIG. 5. Since a memory cell A/B judged to be a lower tail fail bit of the second state S2 is at a state where a cell program operation is not passed, original target data stored at data latches DL1 to DLk may be recovered as the target data TD. Since a memory cell C, which is an upper tail of the first state S1 and is not judged to be an upper tail fail bit, is an on-cell as a result of a read operation for data recovery, data corresponding to the first state S1 may be recovered to target data TD. Since a memory cell D, which is an upper tail of the first state S1 and is judged to be an upper tail bit, is an off-cell as a result of a read operation for data recovery and a recovery reference bit RRB has a value of '1' indicating a recovery of an upper tail fail bit of the first state S1, data corresponding to the first state S1 may be recovered to target data TD.

FIG. 8 is a diagram illustrating data states of latches of a page buffer at a data recovery operation in FIG. 7. Referring to FIGS. 2, 7, and 8, data states of latches at a data recovery operation may be formed of a combination of data states of latches on a second state S2 in FIG. 4 and data states of latches on a first state S1 in FIG. 6. As illustrated in FIG. 8, when data of data latches DL1 to DLk on a second state S2 is not a pass pattern indicating a passed cell program operation, a memory cell placed at A or B may be judged to be a lower tail fail bit of the second state S2, and data stored at the data latches DL1 to DLk may be recovered directly as target data TD. But, when data of the data latches DL1 to DLk on the first state S1 is a pass pattern indicating a passed cell program operation and data corresponding to an on-cell is stored at a sense latch SL as a result of a read operation for data recovery, data S1 corresponding to the first state may be recovered as target data TD based on read data. Herein, a memory cell placed at B may not be judged to be an upper tail fail bit. When data of the data latches DL1 to DLk on the first state S1 is a pass pattern indicating a passed cell program operation and data corresponding to an off-cell is stored at a sense latch SL as a result of a read operation for data recovery, a memory cell placed at D may be judged to be an upper tail fail bit of the first state S1 based on read data and a recovery reference bit RRB, and data S1 corresponding to the first state S1 may be recovered as target data TD. In brief, with the above-described data recovery operation, when a cell program operation is failed, original target data stored at data latches DL1 to DLk may be recovered as target data TD. When a cell program operation is passed, target data TD may be recovered using a read operation for data recovery and a recovery reference bit RRB.

Figure 9:
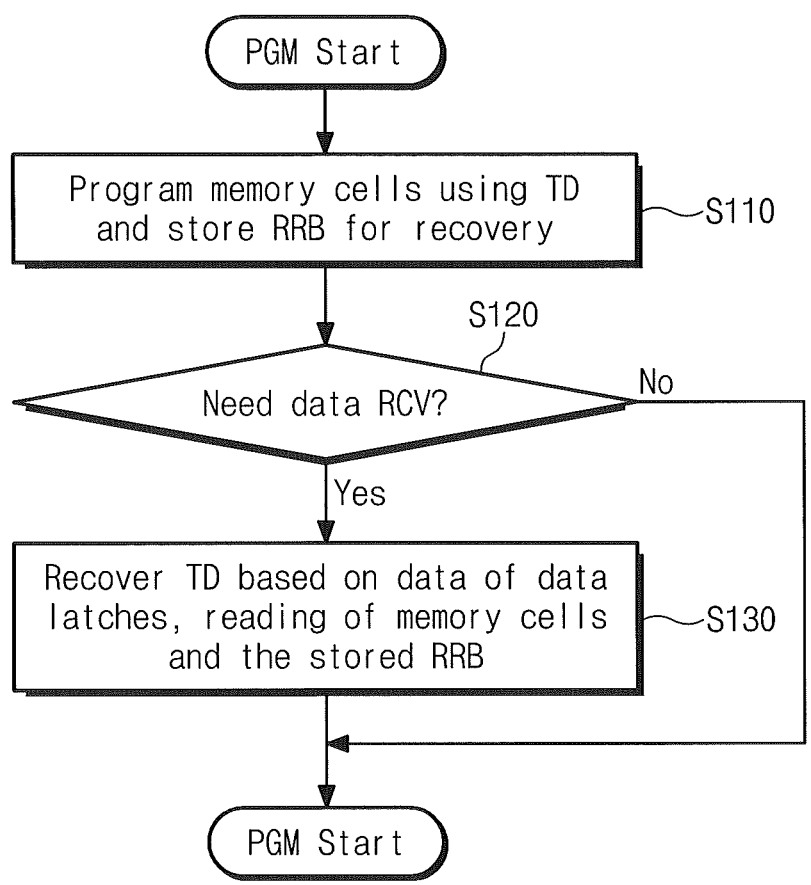
FIG. 9 is a flowchart schematically illustrating a program method of a nonvolatile memory device according to an embodiment of the inventive concept.

FIG. 9 is a flowchart schematically illustrating a program method of a nonvolatile memory device according to an embodiment of the inventive concept. Referring to FIG. 9, a program operation may be executed using target data TD. In operation S110, page buffers PB1 to PBn corresponding to memory cells may be set by a recovery reference bit RRB, respectively. In operation S120, whether a data recovery operation is required may be judged. Herein, the data recovery operation may start when a total program operation is failed or when a data recovery command is received from an external device. When a data recovery operation is not required, a program operation may be ended. When a data recovery operation is required, in operation S130, target data TD may be recovered using data of data latches DL1 to DLk, a read operation on memory cells, and a recovery reference bit RRB.

Figure 10:
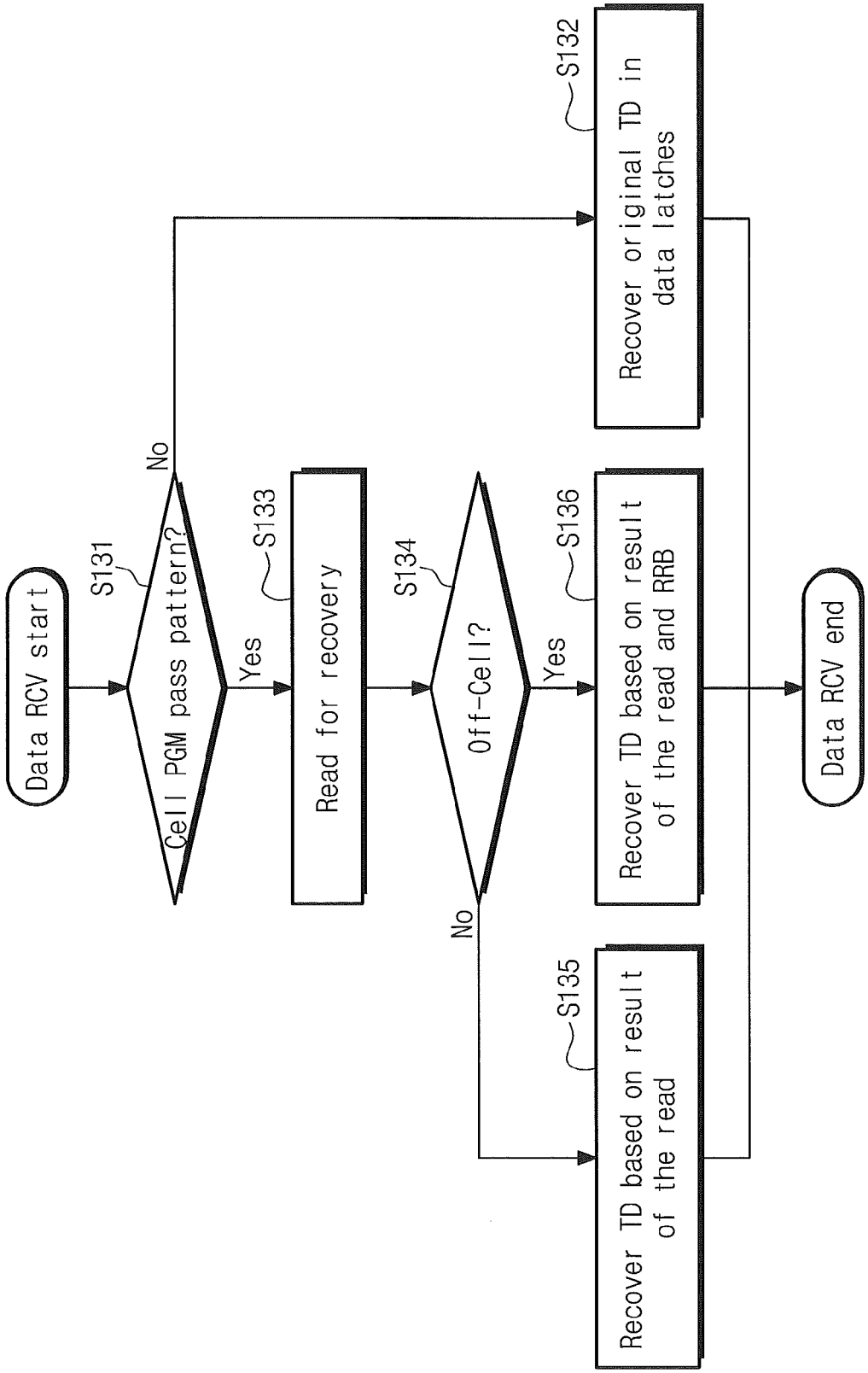
FIG. 10 is a flowchart schematically illustrating a data recovery operation described in FIG. 9.

FIG. 10 is a flowchart schematically illustrating a data recovery operation described in FIG. 9. Referring to FIG. 10, in operation 5131, whether data of data latches DL1 to DLk has a pass pattern indicating a passed cell program operation may be judged. If data of data latches DL1 to DLk does not have a pass pattern therein, the data latches DL1 to DLk may maintain original target data. The reason may be that a cell program operation is failed. In operation S132, original target data may be recovered directly from the data latches DL1 to DLk. On the other hand, if data of data latches DL1 to DLk has a pass pattern, that is, when a cell program operation is passed, in operation S133, a read operation for data recovery may be performed. In operation S134, whether the read data is off-cell data may be judged.

If the read data is not off-cell data but on-cell data, in operation S135, data corresponding to a first state S1 may be recovered to target data TD based on a pass pattern of the data latches DL1 to DLk and the read data. If the read data is off-cell data, in operation S136, an upper tail fail bit (e.g., D in FIG. 7) of the first state S1 may be judged according to data of the data latches DL1 to DLk, the read data, and a recovery reference bit RRB, and data S1 corresponding to the first state S1 may be recovered as target data TD. With the data recovery operation, target data TD may be recovered using data of the data latches DL1 to DLk, read data, and a recovery reference bit RRB.

Figure 11:
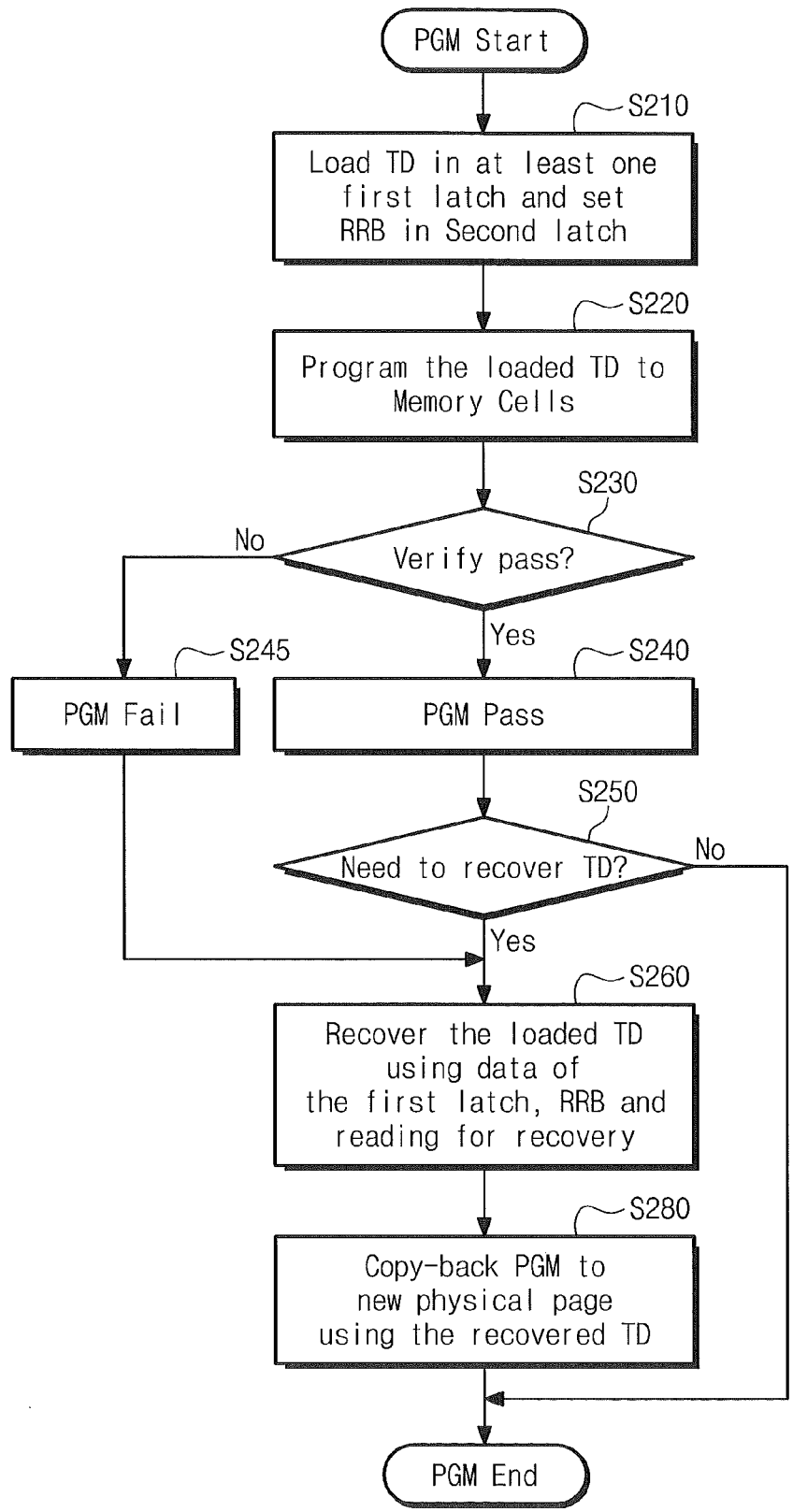
FIG. 11 is a flowchart schematically illustrating a program method of a nonvolatile memory device according to an embodiment of the inventive concept.

FIG. 11 is a flowchart schematically illustrating a program method of a nonvolatile memory device according to an embodiment of the inventive concept. Below, a program method of a nonvolatile memory device will be described with reference to accompanying drawings. In operation S210, target data TD may be loaded onto at least one first latch (e.g., data latches DL1 to DLk), and a recovery reference bit RRB may be stored at a second latch (e.g., an additional latch AL). In operation S220, control logic 140 may control an address decoder 120 and an input/output circuit 130 such that the loaded target data TD is programmed into selected memory cells. For example, program voltages may be applied to word lines connected with the memory cells such that threshold voltages of the memory cells reach program states corresponding to the target data TD. In operation S230, a program verification operation may be performed to judge whether the memory cells are programmed normally. Herein, the program verification operation may be a read operation executed using a verification level of each memory cell. When a verification operation of each memory cell is passed, data latches DL1 to DLk of a page buffer corresponding to a memory cell may written with pass pattern data (e.g., data indicating an erase state). Thus, a pass/fail result of a total program verification operation may be judged according to data stored at the data latches DL1 to DLk of each page buffer.

When the program verification operation is passed, in operation S240, the program operation may be determined to be passed. Afterwards, the method proceeds to operation S250. When the program verification operation is failed, in operation S245, the program operation may be determined to be failed. Afterwards, the method proceeds to operation S260. In operation S250, whether a recovery of target data TD is needed may be judged. An operation of recovering target data TD may be performed in response to a data recovery command provided to a nonvolatile memory device 100 from an external device.

As described above, although the program operation is determined to be passed, a lower tail fail bit (e.g., A and B in FIGS. 3 and 7) of a second state S2 must exist. The reason may be that an upper tail fail bit (e.g., D in FIGS. 5 and 7) of a first state S1 exists and the program operation is passed. Thus, it is necessary to recover the upper or lower tail fail bit for improvement of data reliability.

In example embodiments, a memory system requiring high data reliability may be configured to provide a data recovery command to the nonvolatile memory device 100 anytime during a program operation for data reliability. In other example embodiments, a data recovery command may be instantly provided to the nonvolatile memory device 100 from an external device according to information associated with program fail.

When a recovery of target data TD is required, target data TD may be recovered using at least one read operation and a recovery reference bit RRB stored at a second latch. Herein, a target data recovery operation corresponding to operation S260 may be performed the same as described with reference to FIGS. 1 to 10, and description thereof is thus omitted. In operation S280, a copyback program operation may be performed to program the recovered target data TD at a new physical page. Afterwards, the method may be ended. When a data recovery operation is required, a fail bit (e.g., an upper tail fail bit/lower tail fail bit) of a specific state may be recovered using data of data latches DL1 to DLk, at least one read operation, and a recovery reference bit RRB. Target data TD recovered through a data recovery operation may be directly used for a new program operation. However, the inventive concept is not limited thereto. For example, an error of the recovered target data TD may be corrected, and the error-corrected target data TD may be used for a new program operation.

Figure 12:
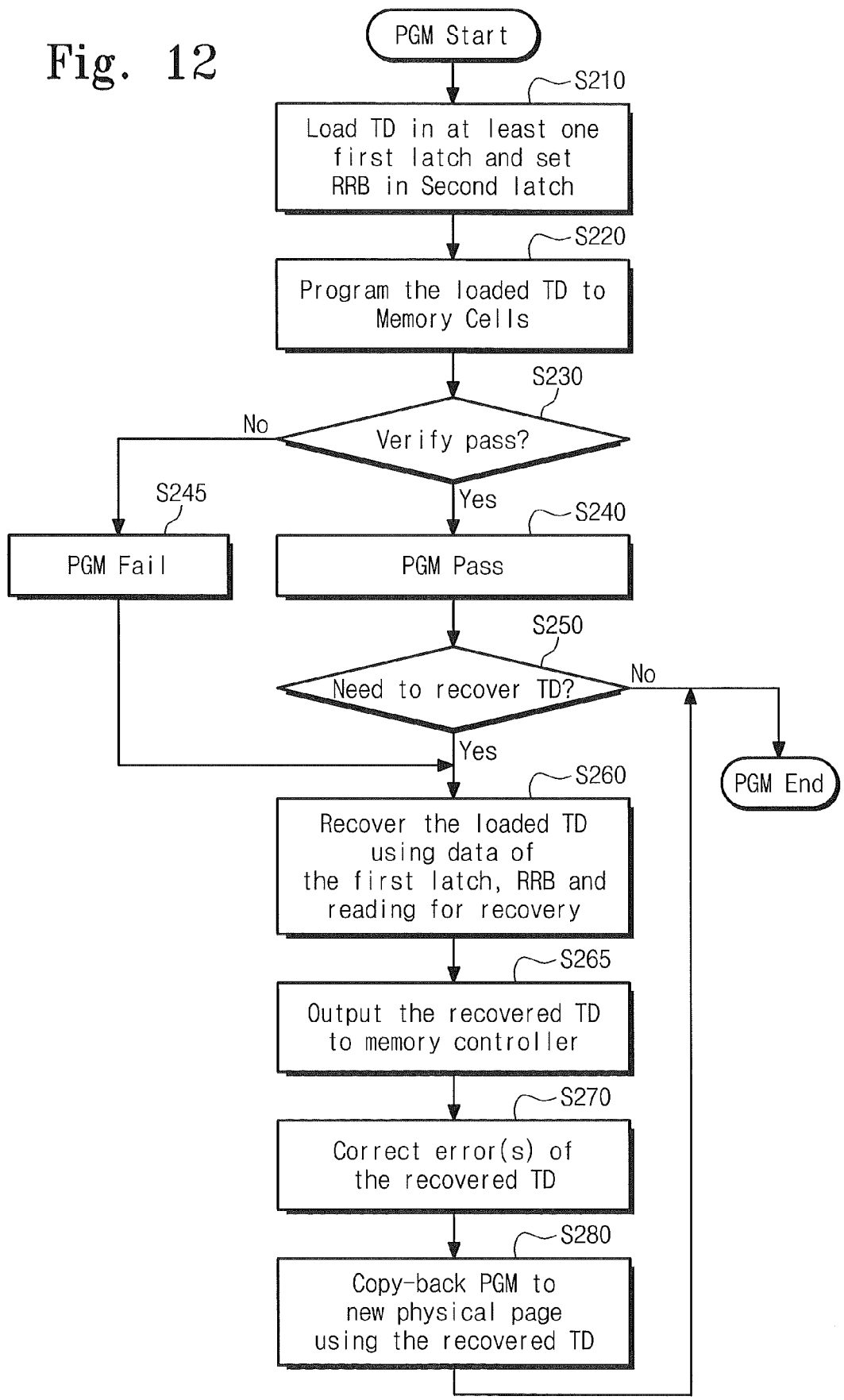
FIG. 12 is a flowchart schematically illustrating a program method of a nonvolatile memory device according to another embodiment of the inventive concept.

FIG. 12 is a flowchart schematically illustrating a program method of a nonvolatile memory device according to another embodiment of the inventive concept. A program method in FIG. 12 may be equal to that in FIG. 11 except that operations S265 and S270 are added. In operation S265, recovered target data may be output to an external memory controller. In operation S270, the memory controller may correct an error in the recovered target data. For example, the memory controller may correct an error in the recovered target data using an error correction code (ECC). However, the inventive concept is not limited thereto. An error correction operation can be executed by an ECC circuit which is provided within a nonvolatile memory device 100. With a program method of the inventive concept, it is possible to improve data reliability by correcting an error of recovered target data. A page buffer PB1 in FIG. 2 may have an additional latch AL for storing a recovery reference bit RRB. The additional latch AL may be used as a latch providing another function. For example, the additional latch AL may be used as a forcing bit latch for bit line forcing.

As will now be described herein below, a bit line forcing operation may be performed to apply a voltage, which is higher than a bit line program voltage (e.g., a ground voltage) and lower than a bit line inhibition voltage (e.g., a power supply voltage), to a bit line at a program operation using a 2-step verification method. The 2-step verification method may be executed to verify a program state, and may include a pre-verification operation executed using a first voltage level and a main verification operation executed using a second voltage level. The 2-step verification method is disclosed in U.S. Pat. Nos. 7,692,970 and 8,068,361 and U.S. Patent Publication Nos. 2011-0292724 and 2011-0110154, the entirety of which is hereby incorporated herein by reference.

Figure 13:
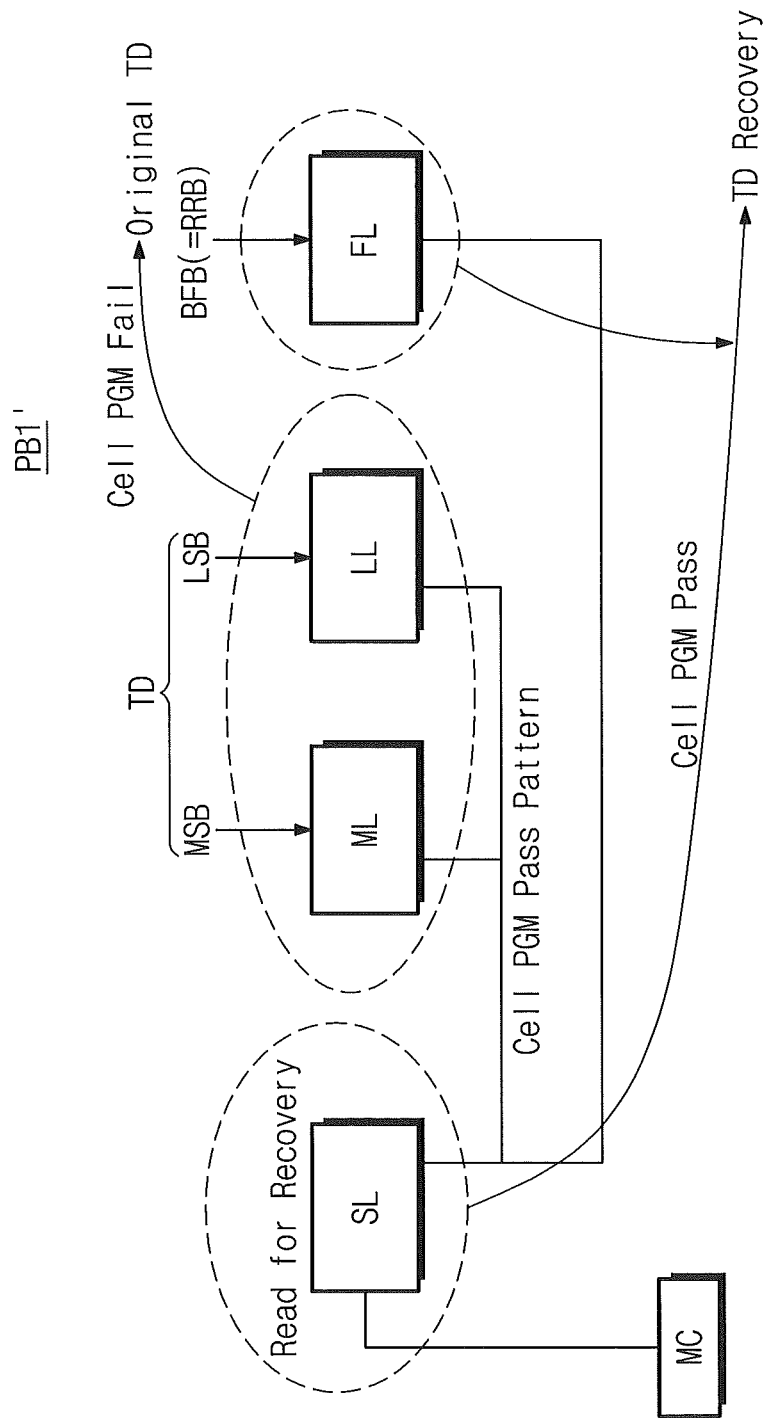
FIG. 13 is a block diagram schematically illustrating a page buffer according to another embodiment of the inventive concept.

FIG. 13 is a block diagram schematically illustrating a page buffer according to another embodiment of the inventive concept. Referring to FIG. 13, a page buffer PB1' may include a sense latch SL, an upper bit latch ML, a lower bit latch LL, and a forcing bit latch FL. Target data TD may include an upper bit (or, a most significant bit: MSB) and a lower bit (or, a least significant bit: LSB). During a program operation, the upper bit MSB may be stored at the upper bit latch ML, and a lower bit LSB may be stored at the lower bit latch LL. A bit line forcing bit BFB may be stored at the forcing bit latch FL. The forcing bit latch FL may also be used as an additional latch storing a recovery reference bit RRB. The bit line forcing bit BFB may be used as a recovery reference bit RRB during a data recovery operation. The reason may be that a special relation exists between the bit line forcing bit BFB and the recovery reference bit RRB.

Because an erase state does not necessitate a program operation, bit line forcing may be unnecessary. Also, the change that an upper tail fail bit is generated may be high due to program disturbance/read disturbance. Thus, data stored at the forcing bit latch FL may be used as a bit line forcing bit BFB indicating whether the bit line forcing is performed or as a recovery reference bit RRB for recovering an upper tail fail bit of an erase state. On the other hand, since a program state necessitates a program operation, the bit line forcing may be required. Also, the change that an upper tail fail bit is generated may become lower compared with the erase state. If a program operation is passed, pass pattern data may be stored at the upper and lower bit latches ML and LL, respectively. Herein, the pass pattern data may be data (e.g., '11') corresponding to an erase state. When a cell program operation is passed, target data TD may be recovered using a read operation for data recovery, data of the upper and lower bit latches ML and LL, and data of the forcing bit latch FL. When a cell program operation is failed, data stored at the upper and lower bit latches ML and LL may be directly recovered as original target data. The page buffer PB1' of the inventive concept may be configured to recover target data TD using a read operation for data recovery, data of the upper and lower bit latches ML and LL, and data of the forcing bit latch FL.

FIG. 14 is a diagram for describing bit line forcing according to an embodiment of the inventive concept. Referring to FIG. 14, when a program voltage VWL is applied to a word line during a program operation of a memory cell ① having a threshold voltage in a first region RA, a bit line program voltage BLPV (e.g., 0V) may be applied to a bit line. When the program voltage VWL is applied to the word line during a program operation of a memory cell ② having a threshold voltage in a second region RB, a slightly elevated bit line forcing voltage BLFV may be applied to a bit line.

As a program loop is iterated, a memory cell of a region RA far from a target state P may be programmed to an adjacent region RB and a memory cell of the adjacent region RB may be programmed to the target state P. Herein, it is assumed that the bit line program voltage BLPV may be 0V and a bit line program-inhibition voltage BLIV may be a power supply voltage VDD. The memory cell ① in the region RA may be programmed by a difference (VWL) between a word line voltage VWL and a bit line voltage VBL. The memory cell ② in the region RB may be programmed by a difference (VWLP-BLFV) between the word line voltage VWL and the bit line voltage VBL. A memory cell ③ entering the target state P may be a program-inhibited cell, but a difference (VWL-VDD) between the word line voltage VWL and the bit line voltage VBL may be applied to the memory cell ③. Compared with the memory cell ① in the region RA, the memory cell in the region RB may be programmed more finely.

A bit line forcing period may be a period where a bit line forcing voltage BLFV is applied during a program operation of a memory cell in a region RB adjacent to the target state P. Bit line forcing may commence when a threshold voltage exceeds a predetermined value, but is lower than a lower limit value of a target state. A bit line forcing bit BFB may indicate whether bit line forcing is to be performed or not. For example, when a bit line forcing bit BFB of '0' is stored at a forcing bit latch FL, the bit line forcing may be performed during a next program loop. However, when a bit line forcing bit BFB of '1' is stored at the forcing bit latch FL, no bit line forcing may be performed during a next program loop. As shown by FIG. 14, $\Delta ISPP > (BLFV-BLPV)$ and $\Delta ISPP > (BLIV-BLFV)$.

Figure 15:
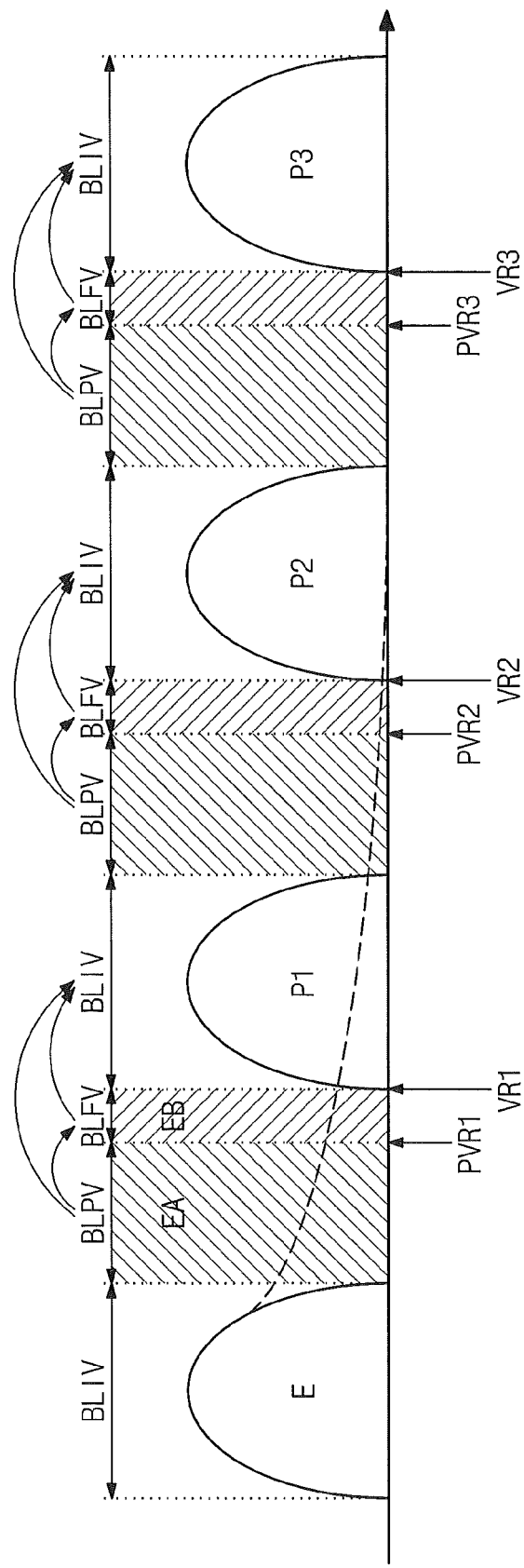
FIG. 15 is a diagram schematically illustrating a 2-step verification method of a page buffer in FIG. 13.

FIG. 15 is a diagram schematically illustrating a 2-step verification method of a page buffer in FIG. 13. In FIG. 15, an erase state E and first to third program states P1, P2, and P3 may be illustrated. In the event that target data TD indicates an erase state E and a memory cell has a threshold voltage corresponding to the erase state E, at a program operation, a bit line inhibition voltage BLIV (e.g., a power supply voltage) may be applied to a bit line corresponding to the memory cell. Herein, target data TD may be data to be programmed.

In the event that target data TD indicates the first program state P1 and a memory cell has a threshold voltage higher than the erase state E and lower than a first pre-verification level PVR1, at a program operation, a bit line program voltage BLPV (e.g., a ground voltage) may be applied to a bit line corresponding to the memory cell. Also, in the event that target data TD indicates the first program state P1 and a memory cell has a threshold voltage higher than the first pre-verification level PVR1 and lower than a first verification level VR1, at a program operation, a bit line forcing voltage BLFV (e.g., 1V) may be applied to a bit line corresponding to the memory cell.

A memory cell in the EA region may reach the first program state P1 through the EB region, or may reach the first program state P1 directly. Until a memory cell reaches the first program state P1, a bit line voltage may be changed to a higher bit line forcing voltage BLFV from a lower bit line program voltage BLPV or into a bit line program inhibition voltage BLIV from the bit line forcing voltage BLFV according to an increase in a program loop. Or, a bit line voltage may be changed into the bit line program inhibition voltage BLIV from the bit line program voltage BLPV according to an increase in a program loop.

In the event that target data TD indicates the second program state P2 and a memory cell has a threshold voltage higher than the first program state P1 and lower than a second pre-verification level PVR2, at a program operation, a bit line program voltage BLPV may be applied to a bit line corresponding to the memory cell. Also, in the event that target data TD indicates the second program state P2 and a memory cell has a threshold voltage higher than the second pre-verification level PVR2 and lower than a second verification level VR2, at a program operation, a bit line forcing voltage BLFV may be applied to a bit line corresponding to the memory cell.

In the event that target data TD indicates the second program state P2 and a memory cell has a threshold voltage higher than the third program state P3 and lower than a third pre-verification level PVR3, at a program operation, a bit line program voltage BLPV may be applied to a bit line corresponding to the memory cell. Also, in the event that target data TD indicates the third program state P3 and a memory cell has a threshold voltage higher than the third pre-verification level PVR3 and lower than a third verification level VR3, at a program operation, a bit line forcing voltage BLFV may be applied to a bit line corresponding to the memory cell.

In sum, at a program operation on each program state, a bit line program voltage BLPV may be applied to a bit line until a pre-verification operation is passed. After the pre-verification operation is passed, a bit line forcing voltage BLFV may be applied to a bit line until a full verification operation is passed. Once the full verification operation is passed, a bit line program inhibition voltage BLIV may be applied to a bit line.

As illustrated in FIG. 15, a memory cell to be programmed with target data TD corresponding to an erase state E may not necessitate the bit line forcing, and a memory cell to be programmed with target data TD corresponding to one of the first to third states P1 to P3 may necessitate the bit line forcing. The erase state E can be over programmed due to program disturbance or read disturbance as illustrated by a dotted line. As described with reference to FIGS. 5 and 6, a value indicating whether bit line forcing is performed may be used as a recovery reference bit RRB for recovering upper tail data of the erase state E.

A nonvolatile memory device 100 of the inventive concept may perform a data recovery operation by using a bit line forcing bit BFB as a recovery reference bit RRB without an additional latch for storing the recovery reference bit RRB.

FIG. 16 is a diagram illustrating a variation in data of latches of a page buffer in FIG. 13 at a program operation. Below, a variation in data of latches of a page buffer in FIG. 13 at a program operation will be described with reference to FIGS. 13 to 16. Herein, a program operation may be a second page program operation (or, an upper bit page program operation). When a second page program operation commences, states of latches ML, LL, and FL may be as follows. In case of a page buffer corresponding to a memory cell the target state of which is an erase state E, the upper bit latch ML may store a value of '1', the lower bit latch LL may store a value of '1', and the forcing bit latch FL may store a value of '1'. In case of a page buffer corresponding to a memory cell the target state of which is a first program state P1, the upper bit latch ML may store a value of '0', the lower bit latch LL may store a value of '1', and the forcing bit latch FL may store a value of '1'. In case of a page buffer corresponding to a memory cell the target state of which is a second program state P2, the upper bit latch ML may store a value of '0', the lower bit latch LL may store a value of '0', and the forcing bit latch FL may store a value of '1'. In case of a page buffer corresponding to a memory cell the target state of which is a third program state P3, the upper bit latch ML may store a value of '1', the lower bit latch LL may store a value of '0', and the forcing bit latch FL may store a value of '1'.

After the second page program operation is ended, states of the latches ML, LL, and FL may be as follows. In case of a page buffer corresponding to a memory cell the target state of which is the erase state E or a program state, the upper bit latch ML may maintain a value of '1', the lower bit latch LL may maintain a value of '1', and the forcing bit latch FL may maintain a value of '1'. In case of a page buffer corresponding to a memory cell the target state of which is the first a program state P1, data of the upper bit latch ML may be changed into '1' from '0', the lower bit latch LL may maintain a value of '1', and data of the forcing bit latch FL may be changed into '0' from '1'. Since a program operation for programming a memory cell to the first program state P1 is passed, the upper bit latch ML and the lower bit latch LL may store a data pattern of '11' corresponding to the erase state E. Also, since bit line forcing is performed, the forcing bit latch FL may store a value of '0'.

In case of a page buffer corresponding to a memory cell the target state of which is the second program state P2, data of the upper bit latch ML may be changed into '1' from '0', data of the lower bit latch LL may be changed into '1' from '0', and data of the forcing bit latch FL may be changed into '0' from Since a program operation for programming a memory cell to the second program state P2 is passed, the upper bit latch ML and the lower bit latch LL may store a data pattern of '11' corresponding to the erase state E. Also, since bit line forcing is performed, the forcing bit latch FL may store a value of '0'.

In case of a page buffer corresponding to a memory cell the target state of which is the third program state P3, the upper bit latch ML may keep a value of '1', data of the lower bit latch LL may be changed into '1' from '0', and data of the forcing bit latch FL may be changed into '0' from '1'. Since a program operation for programming a memory cell to the third program state P3 is passed, the upper bit latch ML and the lower bit latch LL may store a data pattern of '11' corresponding to the erase state E. Also, since bit line forcing is performed, the forcing bit latch FL may store a value of '0'.

Figure 17:
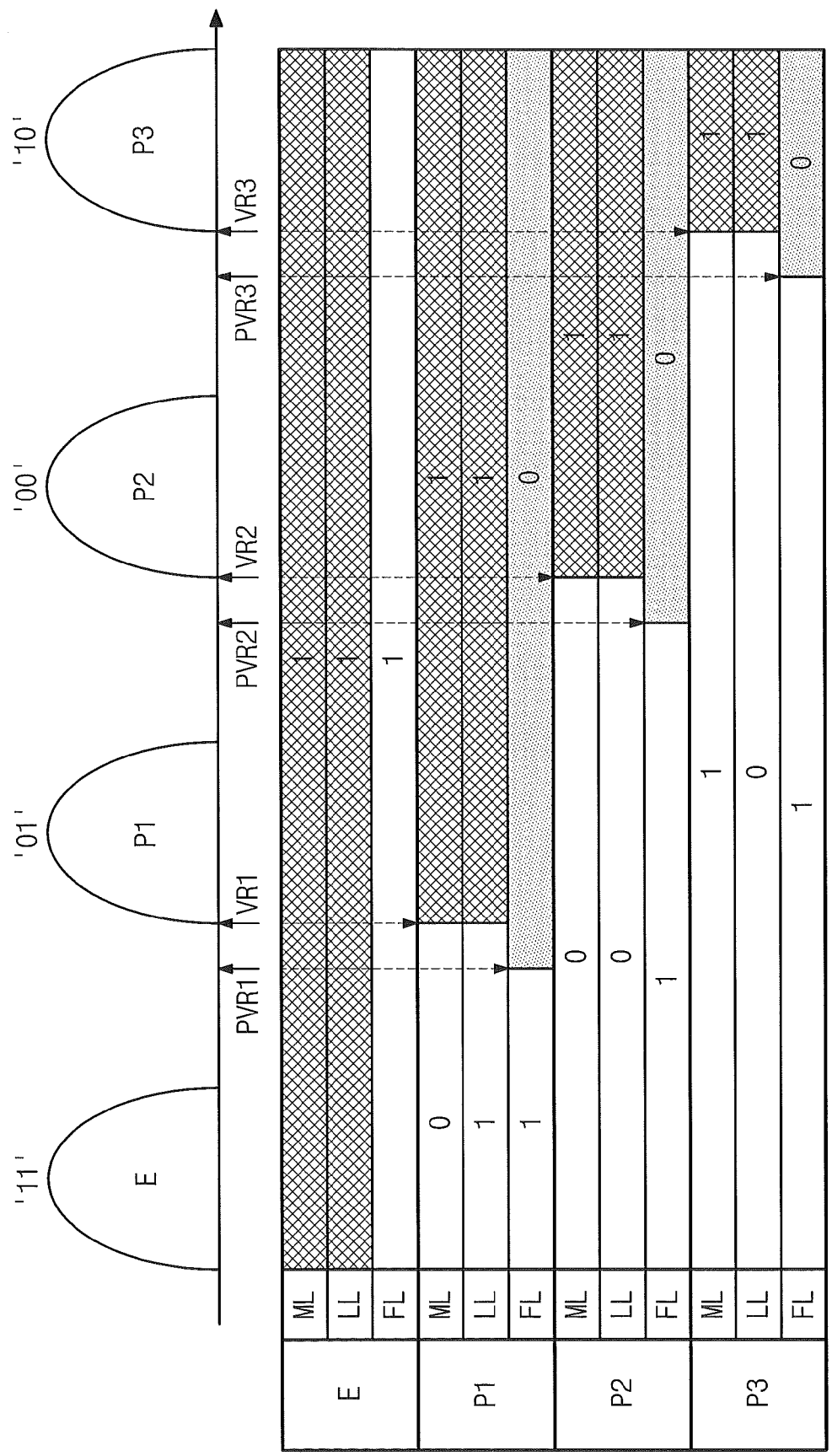
FIG. 17 is a diagram illustrating a variation in data of latches of a page buffer corresponding to a target state at a program operation according to an embodiment of the inventive concept.

FIG. 17 is a diagram illustrating a variation in data of latches of a page buffer corresponding to a target state at a program operation according to an embodiment of the inventive concept. Referring to FIG. 17, an erase state E may correspond to data '11', a first program state P1 to data '01', a second program state P2 to data '00', and a third program state P3 to data '10'. However, the inventive concept is not limited thereto. When a target state is the erase state E, a variation in data stored at latches ML, LL, and FL of a page buffer corresponding to a memory cell will be as follows. The upper bit latch ML and the lower bit latch LL may store '1' regardless of a threshold voltage of a memory cell. Since no bit line forcing is required, the forcing bit latch FL may store '1'.

When a target state is the first program state P1, a variation in data stored at the latches ML, LL, and FL of a page buffer corresponding to a memory cell to be programmed will be as follows. Until a threshold voltage of a memory cell exceeds a first verification level VR1 (i.e., before a first verification operation is passed), the upper bit latch ML may store '0' and the lower bit latch LL may store '1'. After a threshold voltage of a memory cell exceeds the first verification level VR1 (i.e., after the first verification operation is passed), the upper bit latch ML and the lower bit latch LL may store '1'. That is, after the first verification operation is passed, the upper bit latch ML may store '1' and the lower bit latch LL may store the same pass pattern data as data corresponding to the erase state E.

Until a threshold voltage of a memory cell exceeds a first pre-verification level PVR1 (i.e., before a first pre-verification operation is passed), the forcing bit latch FL may store '1'. After a threshold voltage of a memory cell exceeds the first pre-verification level PVR1 (i.e., after the first pre-verification operation is passed), the forcing bit latch FL may store '0'. Herein, if '0' is stored at the forcing bit latch FL, bit line forcing may be performed during a next program loop. That is, a bit line forcing voltage BLFV may be applied to a bit line during a next program loop.

When a target state is the second program state P2, a variation in data stored at the latches ML, LL, and FL of a page buffer corresponding to a memory cell to be programmed will be as follows. Until a threshold voltage of a memory cell exceeds a second verification level VR2 (i.e., before a second verification operation is passed), the upper bit latch ML and the lower bit latch LL may store '0'. After a threshold voltage of a memory cell exceeds the second verification level VR2 (i.e., after the second verification operation is passed), the upper bit latch ML and the lower bit latch LL may both store '1'. Until a threshold voltage of a memory cell exceeds a second pre-verification level PVR2 (i.e., before a second pre-verification operation is passed), the forcing bit latch FL may store '1'. After a threshold voltage of a memory cell exceeds the second pre-verification level PVR2 (i.e., after the second pre-verification operation is passed), the forcing bit latch FL may store '0'. Herein, if '0' is stored at the forcing bit latch FL, bit line forcing may be performed during a next program loop (i.e., next ISPP pulse).

When a target state is the third program state P3, a variation in data stored at the latches ML, LL, and FL of a page buffer corresponding to a memory cell to be programmed will be as follows. Until a threshold voltage of a memory cell exceeds a third verification level VR3 (i.e., before a third verification operation is passed), the upper bit latch ML may store '1' and the lower bit latch LL may store '0'. After a threshold voltage of a memory cell exceeds the third verification level VR2 (i.e., after the third verification operation is passed), the upper bit latch ML and the lower bit latch LL may both store '1'. Until a threshold voltage of a memory cell exceeds a third pre-verification level PVR3 (i.e., before a third pre-verification operation is passed), the forcing bit latch FL may store '1'. After a threshold voltage of a memory cell exceeds the third pre-verification level PVR3 (i.e., after the third pre-verification operation is passed), the forcing bit latch FL may store '0'. Herein, if '0' is stored at the forcing bit latch FL, bit line forcing may be performed during a next program loop (i.e., during next ISPP pulse). As described above, if a verification operation on a target state is passed, data of the upper bit latch ML and the lower bit latch LL may be changed into pass pattern data (e.g., "11"). If a pre-verification operation on a target state is passed, data of the forcing bit latch FL may be changed into data (e.g., '0') directing execution of bit line forcing during a next program loop.

Figure 18:
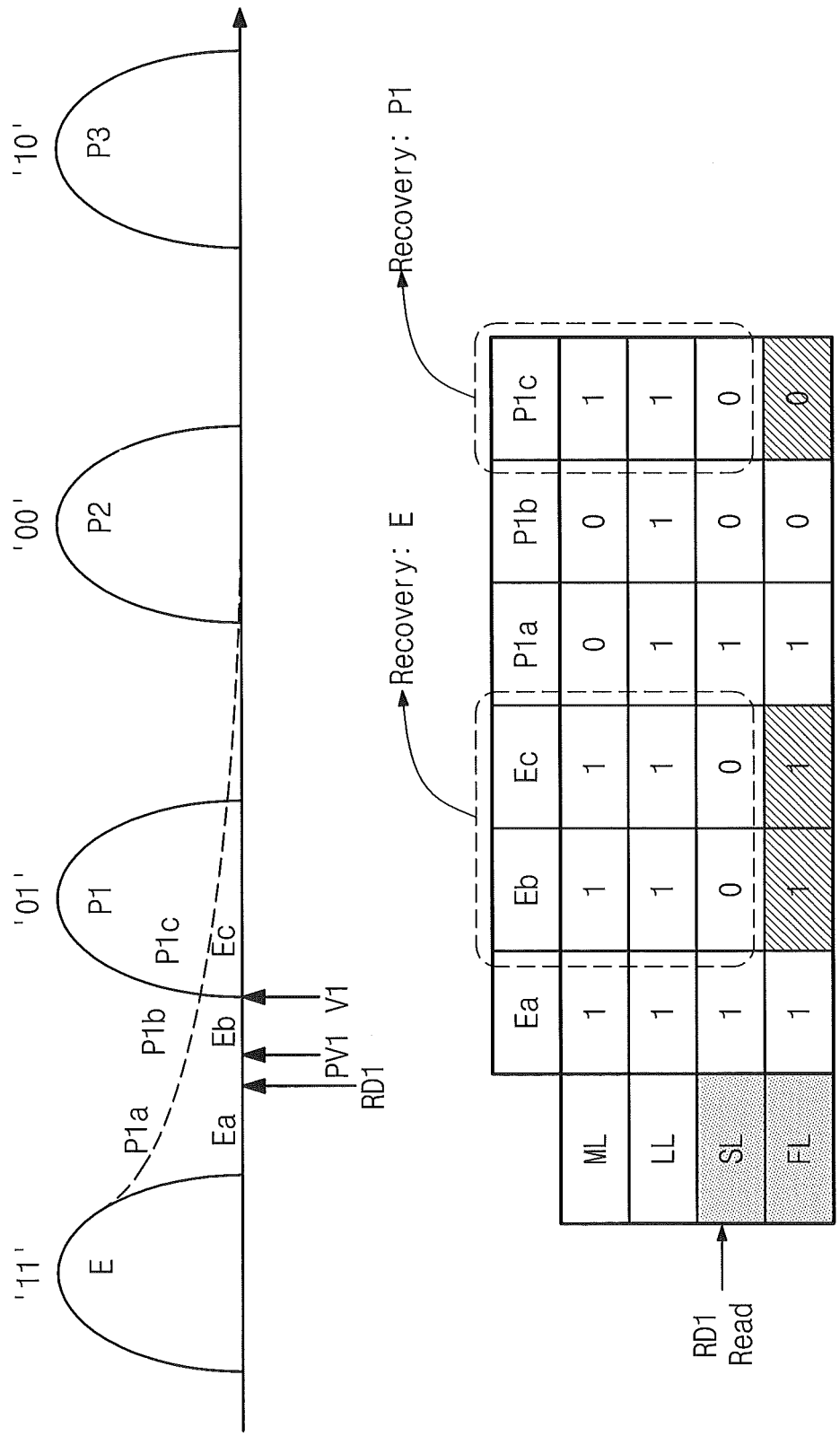
FIG. 18 is a diagram schematically illustrating a method of recovering data between an erase state and a first program state.

FIG. 18 is a diagram schematically illustrating a method of recovering data between an erase state and a first program state. Referring to FIG. 18, when a target state is an erase state E, a memory cell Ea may have a threshold voltage lower than a first pre-verification voltage PV1, a memory cell Eb may have a threshold voltage higher than the first pre-verification voltage PV1 and lower than a first verification voltage V1, and a memory cell Ec may have a threshold voltage higher than the first verification voltage V1.

When a target state is a first program state P1, a memory cell P1a may have a threshold voltage lower than the first pre-verification voltage PV1, a memory cell P1b may have a threshold voltage higher than the first pre-verification voltage PV1 and lower than the first verification voltage V1, and a memory cell P1c may have a threshold voltage higher than the first verification voltage V1

Values stored at latches ML, LL, SL, and FL associated with each memory cell may be as illustrated in the table of FIG. 18. The upper bit latch ML may store an upper bit MSB of a target state, the lower bit latch LL may store a lower bit LSB of the target state, the sense latch SL may store a value obtained by performing a read operation using a first read level RD1 for a data recovery operation, and the forcing bit latch FL may store a bit line forcing bit BFB. When a cell program operation is passed, the upper bit latch ML and the lower bit latch LL may be written with logic "1" values. If a result of the read operation indicates an on-cell, the sense latch SL may store '1'. If a result of the read operation indicates an off-cell, the sense latch SL may store '0'. The bit line forcing bit BFB may be '1' when no bit line forcing is performed and '0' when bit line forcing is performed.

When the target state is the erase state E, the upper and lower bit latches ML and LL associated with each of memory cells Ea, Eb, and Ec may store '1', the sense latch SL associated with the memory cell Ea may store '1', the sense latches SL associated with the remaining memory cells Eb and Ec may store '0', and the forcing bit latches FL associated with the memory cells Ea, Eb, and Ec may store '1'

When the target state is the first program state P1, the upper bit latch ML associated with each of memory cells P1a and P1b may store '0', the upper bit latch ML associated with a memory cell P1c may store '1', the lower bit latches LL associated with each of the memory cells P1a, P1b, and P1c may store '1', the sense latch SL associated with the memory cell P1a may store '1' (i.e., on-cell), the sense latches SL associated with the remaining memory cells P1b and P1c may store '0', the forcing bit latches FL associated with the memory cell P1a may store '1', and the forcing bit latches FL associated with the memory cells P1b and P1c may store '0'

As illustrated by dotted boxes in FIG. 18, the latches ML, LL, and SL associated with the memory cells Eb, Ec, and P1c may store the same data. Thus, it is difficult to find a target state through a read operation for data recovery using a first read level RD1. In this case, whether a target state is an erase state E or a first program state P1 may be judged according to a value stored at a forcing bit line FL. For example, a value stored at a forcing bit latch FL of each of memory cells Eb and Ec may be '1' and a value stored at a forcing bit latch FL of a memory cell P1c may be '0'. Although the latches ML, LL, and SL associated with the memory cells Eb, Ec, and P1c store the same data, whether a target state is an erase state E or a first program state P1 may be exactly recovered according to a value stored at a forcing bit line FL. In FIG. 18, there may be illustrated the case that a first read level RD1 is lower than a first pre-verification level PV1. However, the inventive concept is not limited thereto. For example, the first read level RD1 may be set to be higher than the first pre-verification level PV1 and lower than a first verification level V1.

Figure 19:
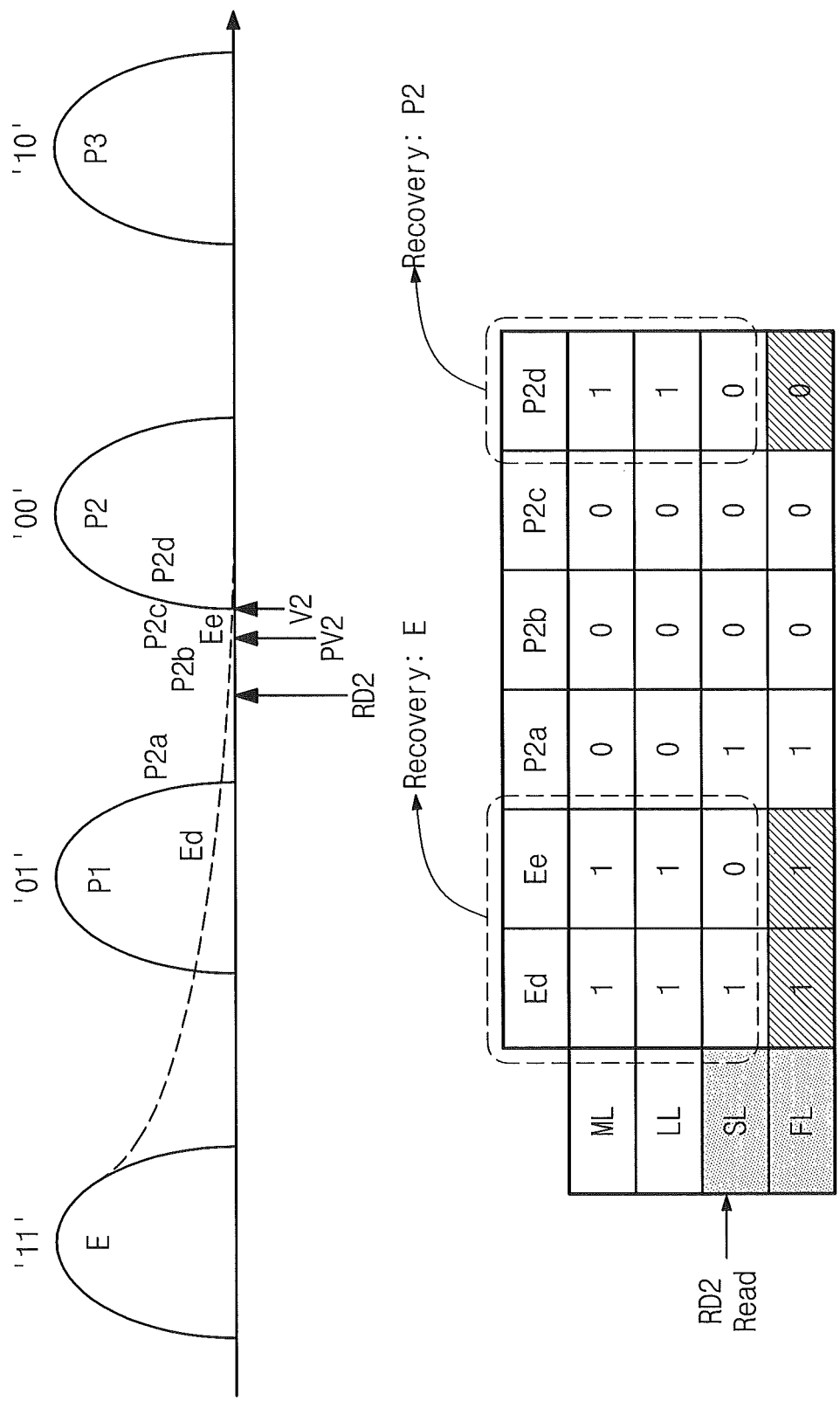
FIG. 19 is a diagram schematically illustrating a method of recovering data between an erase state and a second program state.

FIG. 19 is a diagram schematically illustrating a method of recovering data between an erase state and a second program state. Referring to FIG. 19, when a target state is an erase state E, a memory cell Ed may have a threshold voltage lower than a second pre-verification voltage PV2, a memory cell Ee may have a threshold voltage higher than the second pre-verification voltage PV2 and lower than a second verification voltage V2. When a target state is a second program state P2, a memory cell P2a may have a threshold voltage lower than the second read level RD2, a memory cell P2b may have a threshold voltage higher than the second read level RD2 and lower than a second pre-verification voltage PV2, a memory cell P1c may have a threshold voltage higher than the second pre-verification voltage PV2 and lower than a second verification voltage V2, and a memory cell P2d may have a threshold voltage higher than the second verification voltage V2.

Values stored in latches ML, LL, SL, and FL associated with each memory cell may be as illustrated in FIG. 19. As illustrated by dotted boxes in FIG. 19, the latches ML, LL, and SL associated with the memory cells Ee and P2d may store the same data. Thus, it is difficult to find a target state through a read operation for data recovery using a second read level RD2. If a value stored at a forcing bit latch FL is '1', a target state may become an erase state E. If a value stored at a forcing bit latch FL is '0', a target state may become a second program state P2.

Figure 20:
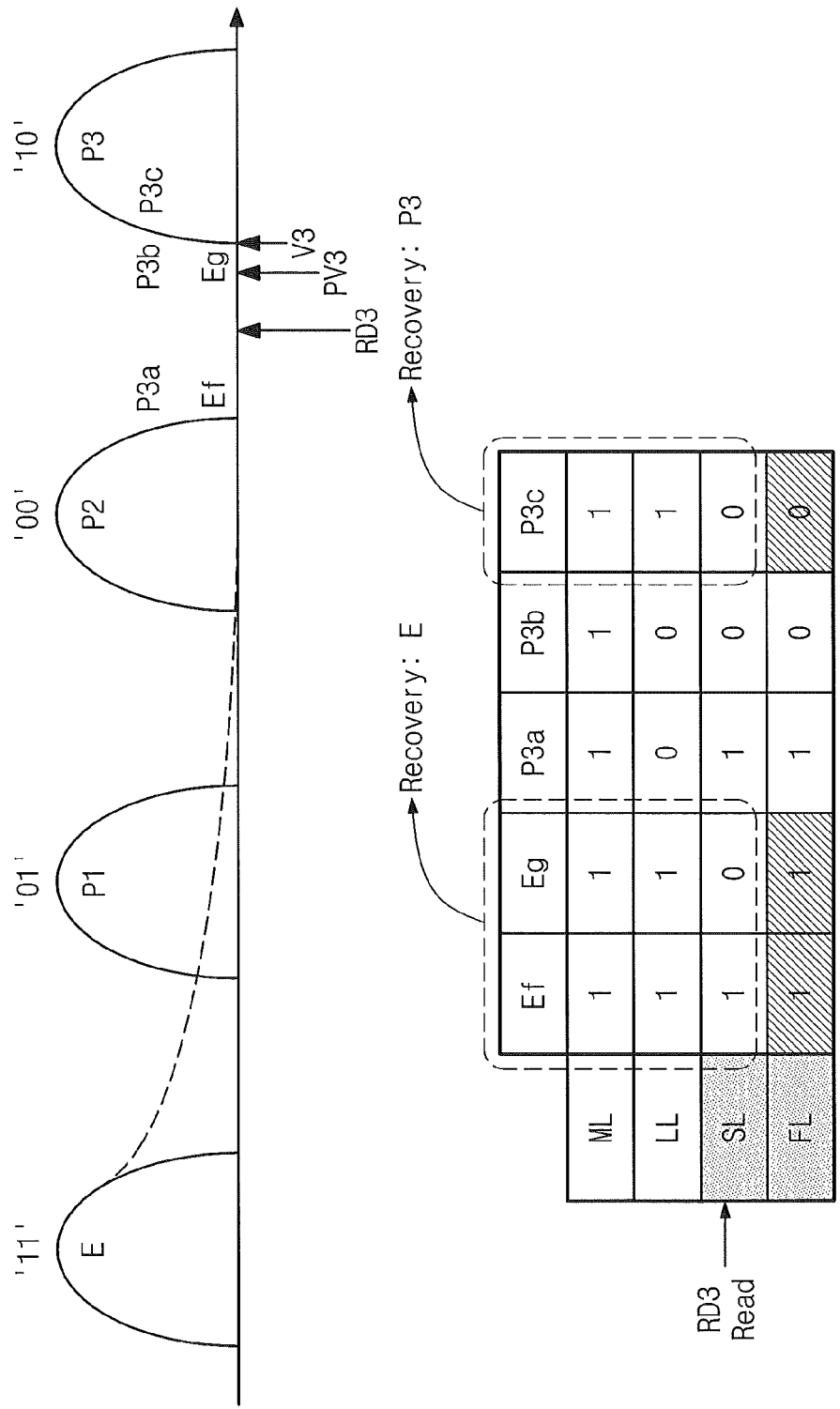
FIG. 20 is a diagram schematically illustrating a method of recovering data between an erase state and a third program state.

FIG. 20 is a diagram schematically illustrating a method of recovering data between an erase state and a third program state. Referring to FIG. 20, when a target state is an erase state E, a memory cell Ef may have a threshold voltage lower than a third pre-verification voltage PV3, a memory cell Eg may have a threshold voltage higher than the third pre-verification voltage PV3 and lower than a third verification voltage V3. When a target state is a third program state P3, a memory cell P3a may have a threshold voltage lower than the third pre-verification voltage PV3, a memory cell P3b may have a threshold voltage higher than the third pre-verification voltage PV3 and lower than a third verification voltage V3, and a memory cell P3c may have a threshold voltage higher than the third verification voltage V3.

Values stored latches ML, LL, SL, and FL associated with each memory cell may be as illustrated in FIG. 20. As illustrated by dotted boxes in FIG. 20, the latches ML, LL, and SL associated with the memory cells Eg and P3c may store the same data. Thus, it is difficult to find a target state through a read operation for data recovery using a third read level RD3. If a value stored at a forcing bit latch FL is '1', a target state may become an erase state E. If a value stored at a forcing bit latch FL is '0', a target state may become a third program state P3.

In FIGS. 18 to 20, there may be illustrated cases that a data recovery operation necessitates three read operations. However, the inventive concept is not limited thereto. Target data may be recovered by combining data of data latches ML and LL, data of a sense latch SL according to a read operation, and data of a forcing bit latch FL in various manners. For example, it is possible to recover an upper bit through one read operation for data recovery.

Figure 21:
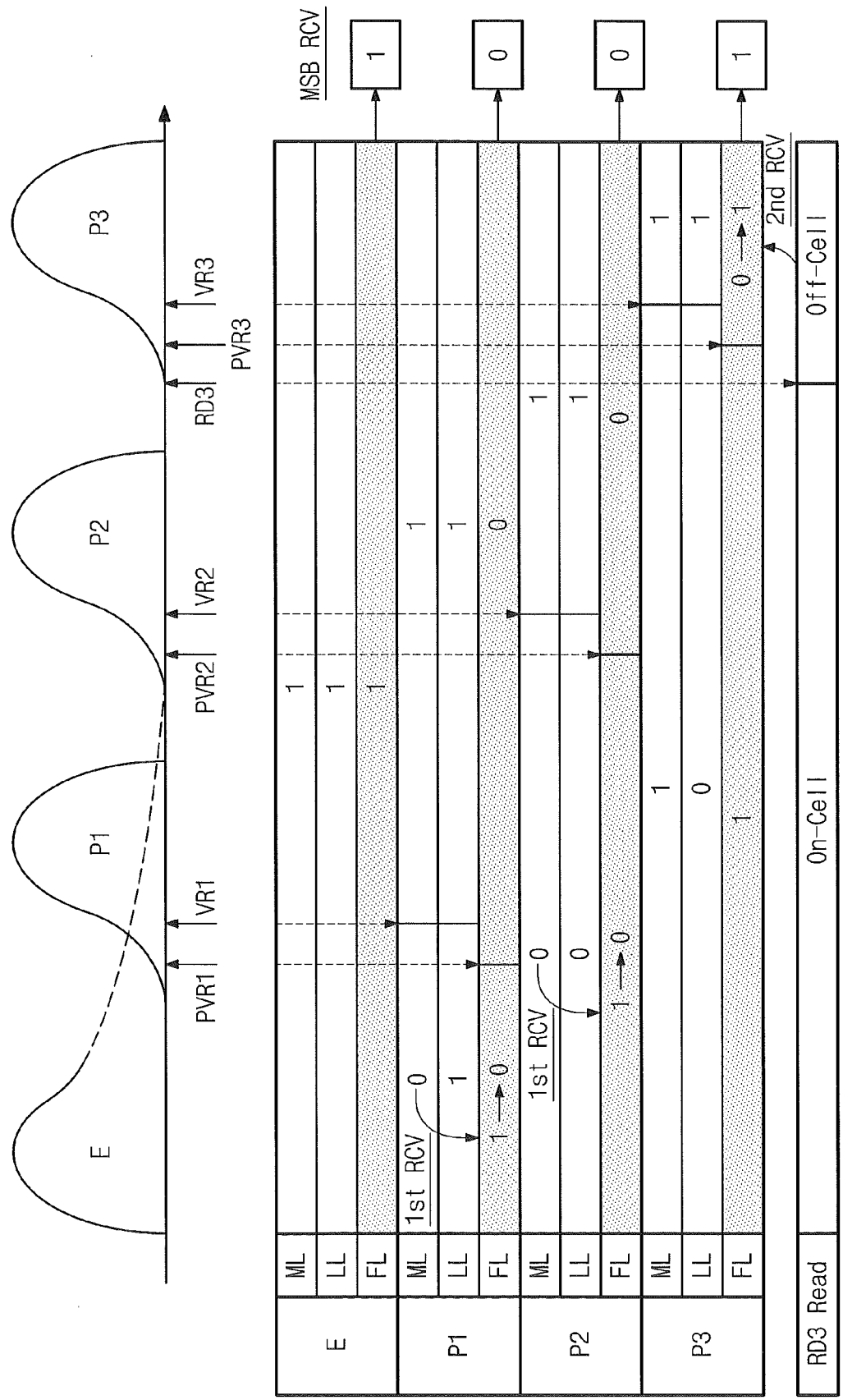
FIG. 21 is a diagram schematically illustrating an upper bit recovery method at a program operation according to an embodiment of the inventive concept.

FIG. 21 is a diagram schematically illustrating an upper bit recovery method at a program operation according to an embodiment of the inventive concept. Referring to FIG. 21, an upper bit recovery method of each of states E, P1, P2, and P3 at a data recovery operation will be as follows. First of all, an upper bit recovery method when a target state is an erase state E will be described. When '1' is stored at an upper bit latch ML, a lower bit latch LL, and a forcing bit latch FL, a target state may be judged to be the erase state E. As illustrated in FIG. 18, a state that 1' is stored at the upper bit latch ML, the lower bit latch LL, and the forcing bit latch FL may only specify the erase state E. In this case, during a program operation, an upper tail fail bit of the erase state E may be recovered from a data state of the latches ML, LL, and FL. The '1' stored at the forcing bit latch FL may be output as an upper bit of the erase state E.

An upper bit recovery operation when a target state is a program state P1/P2/P3 may be divided into two recovery operations $1^{st}$ RCV and $2^{nd}$ RCV. At the first recovery operation $1^{st}$ RCV, data of the forcing bit latch FL may be changed into '0' from '1' when '0' is stored at the upper bit latch ML of a page buffer corresponding to a memory cell not being program passed. As illustrated in FIG. 18, when '0' is stored at the upper bit latch ML at the first and second program states P1 and P2, data of the forcing bit latch FL may be changed into '0' at the first recovery operation $1^{st}$ RCV. Thus, when a target state is the first/second program state P1/P2, the forcing bit latch FL may store '0' finally. Herein, '0' finally stored at the forcing bit latch FL may be output as upper bits of the first and second program states P1 and P2.

During the second recovery operation $2^{nd}$ RCV, a read operation may be performed using a third read level RD3. When a memory cell is judged to be an off-cell according to a result of a read operation, data of the forcing bit latch FL may be changed into '1' from '0'. As illustrated in FIG. 18, data of the forcing bit latch FL may be changed into '1' at the third program state P3. It is assumed that upper tail fail bits of the first and second program states P1 and P2 are scarcely generated at the second recovery operation $2^{nd}$ RCV. With this assumption, '1' finally stored at the forcing bit latch FL may be output as an upper bit of the third program state P3. With the above-described data recovery operation, it is possible to recover target data (upper bit) using data of data latches ML and LL, data of a forcing bit latch FL, and a read operation. An operation of recovering an upper bit may be described with reference to FIG. 21. Similarly, a lower bit may be recovered through data of latches ML, LL, and FL and a read operation.

Figure 22A:
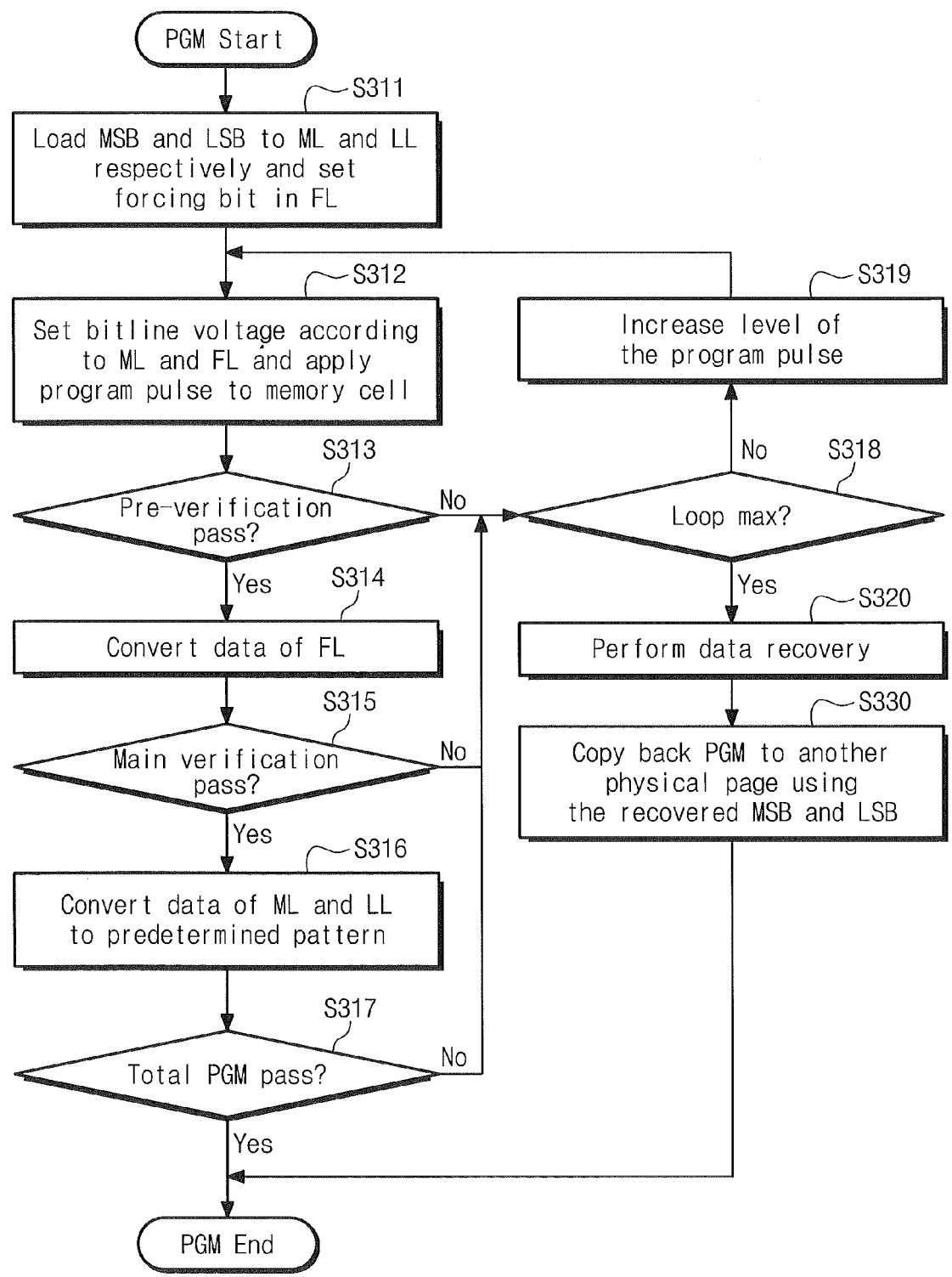
FIGS. 22A and 22B are flowcharts illustrating a multi-bit program method of a nonvolatile memory device according to an embodiment of the inventive concept.
Figure 22B:
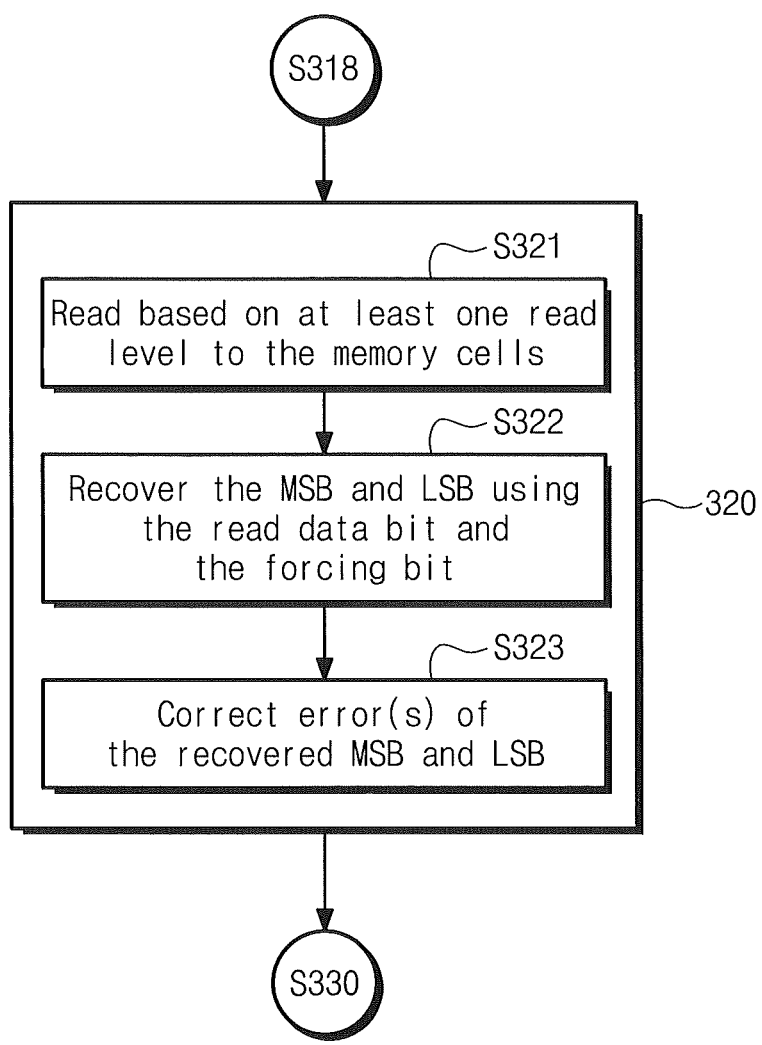

FIGS. 22A and 22B are flowcharts illustrating a multi-bit program method of a nonvolatile memory device according to an embodiment of the inventive concept. A multi-bit program method of a nonvolatile memory device will be described with reference to FIGS. 1, 13, 22A, and 22B.

In operation S311, an upper bit MSB may be loaded onto an upper bit latch ML and a lower bit LSB may be loaded onto a lower bit latch LL. At this time, a forcing bit latch FL may be set with a default forcing bit (e.g., '1'). Or, a default forcing bit (e.g., '1') may be stored at the forcing bit latch FL. Herein, the default forcing bit may be data indicating that bit line forcing is not performed.

In operation S312, a bit line voltage VBL may be determined according to data stored at the upper bit latch ML and the forcing bit latch FL, and a program pulse VWL may be applied to a word line. For example, when data stored at the upper bit latch ML is '0' and data stored at the forcing bit latch FL is '1', the bit line voltage VBL may be set to a bit line program voltage BLPV, that is, a ground voltage GND. When data stored at the upper bit latch ML is '0' and data stored at the forcing bit latch FL is '1', the bit line voltage VBL may be set to a bit line forcing voltage BLFV. If data stored at the upper bit latch ML is '1', the bit line voltage VBL may be set to a bit line inhibition voltage BLIV, that is, a power supply voltage VDD. The program pulse may increase according to iteration of program loops.

In operation S313, a pre-verification operation may be performed, and whether the pre-verification operation is passed may be judged. If the pre-verification operation is judged to be passed, in operation 5314, the bit line forcing bit BFB of the forcing bit latch FL may be changed into '0' from '1'. If the pre-verification operation is judged to be failed, in operation S315, whether a main verification operation is passed may be judged. If the main verification operation is judged to be passed, in operation S316, data of the upper and lower bit latches ML and LL may be changed into pass pattern data (e.g., '11') to be program inhibited at a next program loop. In operation S317, whether a total program operation is passed may be judged.

In the event that the pre-verification operation, the main verification operation, or the total program operation is judged not to be passed, in operation S318, whether a current program loop reaches a maximum program loop may be judged. When the current program loop does not reach the maximum program loop, S319, a program loop number may increase, and a level of the program pulse may increase by a predetermined increment (e.g., ΔISPP). Afterwards, the method proceeds to operation S312.

In the event that the current program loop reaches the maximum program loop, the program operation may be failed. In operation S320, a data recovery operation may be immediately performed in response to program fail. Herein, with the data recovery operation, in operation S321, a read operation on a memory cell may be performed using at least one read level (e.g., RD3 in FIG. 21) as illustrated in FIG. 22B. The loaded upper and lower bits MSB and LSB may be recovered using read data and a forcing bit stored at the forcing bit latch FL. In operation S322, a data recovery operation may be performed the same as described with reference to FIG. 21. In operation S323, the recovered upper and lower bit data MSB and LSB may be error corrected. The error correction operation may be performed within a nonvolatile memory device 100 or by an external memory controller. After the data recovery operation is ended, in operation S330, the recovered upper and lower bit data MSB and LSB may be copied back to a new physical page. Afterwards, the program operation may be ended. With the multi-bit program method of the inventive concept, loaded data (MSB or LSB) may be recovered using a forcing bit indicating whether bit line forcing is required and a result of a read operation on a memory cell in response to program fail.

Total program fail may be determined according to a program loop number. However, the inventive concept is not limited thereto. For example, program fail may be determined according to the number of fail bits. A technique of determining program fail according to the number of fail bits is disclosed in U.S. Patent Publication No. 2011-0051514, the entirety of which is herein incorporated by reference.

Figure 23:
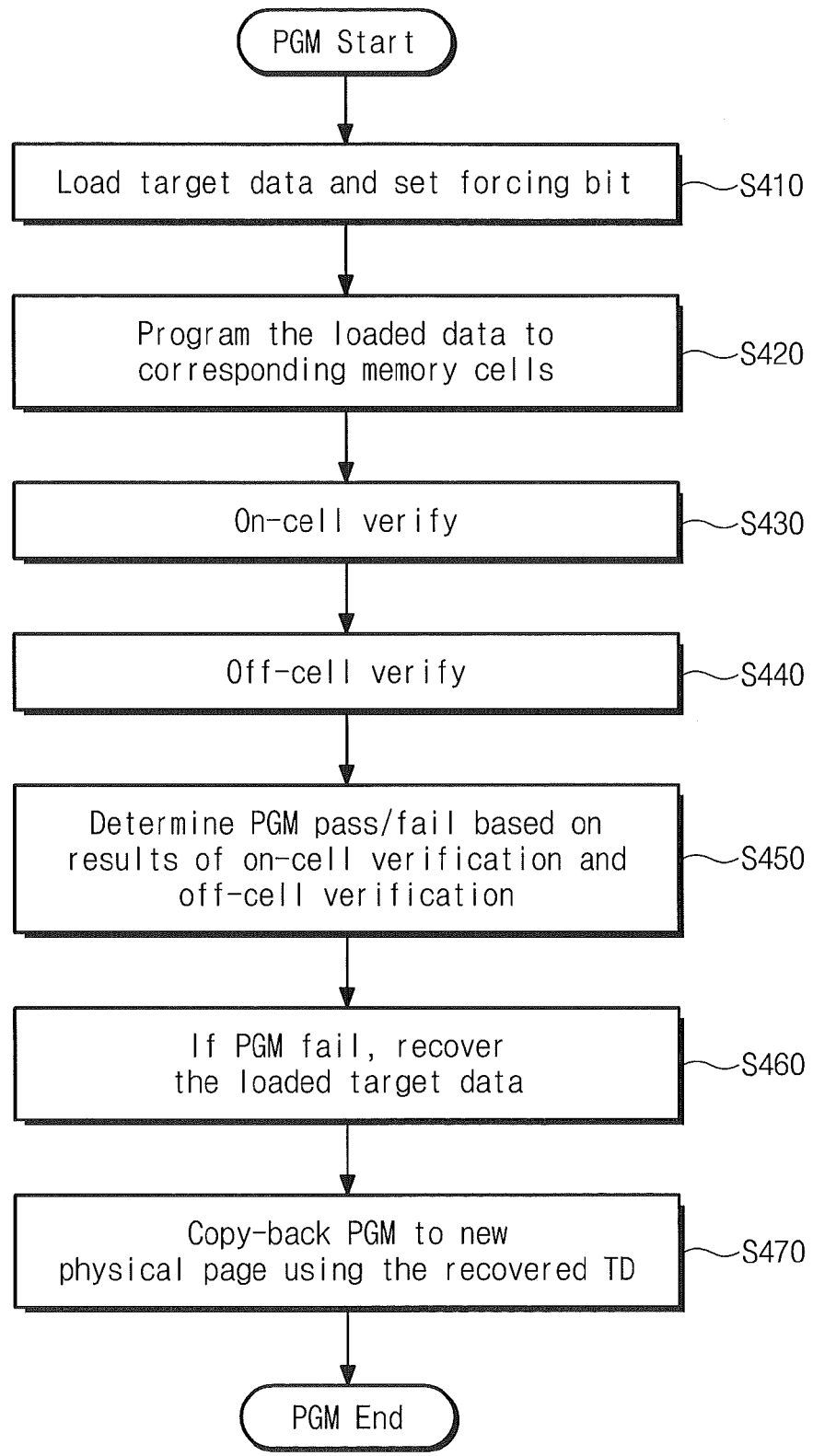
FIG. 23 is a flowchart illustrating a multi-bit program method of a nonvolatile memory device according to another embodiment of the inventive concept.

FIG. 23 is a flowchart illustrating a multi-bit program method of a nonvolatile memory device according to another embodiment of the inventive concept. A multi-bit program method of a nonvolatile memory device will be described with reference to FIGS. 1, 13, and 23.

In operation S410, target data TD to be programmed may be loaded onto data latches (e.g., ML and LL), and a forcing bit latch (e.g., FL) may be set with a forcing bit BFB indicating whether bit line forcing is performed or not. In operation S420, memory cells may be programmed with the loaded data.

Afterwards, an on-cell verification operation may be performed with respect to memory cells. The on-cell verification operation may be performed to verify whether memory cells to be program inhibited are programmed. For example, in operation S430, the on-cell verification operation may be performed to verify whether an erase state E is programmed by program disturbance. In operation S440, an off-cell verification operation may be performed with respect to memory cells. The off-cell verification operation may be performed to verify whether memory cells to be programmed reach a target state corresponding to target data. The on-cell verification operation and the off-cell verification operation are disclosed in U.S. Pat. No. 8,050,101 and U.S. Patent Publication No. 2010-0008149, the entirety of which is herein incorporated by references.

Whether a program operation is passed or failed may be determined according to results of the on-cell verification operation and the off-cell verification operation. For example, if a fail bit number is over a correctable fail bit number as results of the on-cell verification operation and the off-cell verification operation, in operation S450, the program operation may be determined to be program fail. If the program operation is determined to be program fail, in operation S460, a data recovery operation for recovering target data may be performed. The data recovery operation may be performed in a manner which is described with reference to FIGS. 18 to 20 or with reference to FIG. 21. After a data recovery operation is ended, in operation S470, recovered target data may be copied back to a new physical page. Afterwards, the program operation may be ended. With the multi-bit program method of the inventive concept, whether a program operation is failed may be determined according to results of the on-cell verification operation and the off-cell verification operation, and a data recovery operation may be performed at program fail. As described with reference to FIGS. 22 and 23, a data recovery operation may be performed in response to program fail. However, the inventive concept is not limited thereto. For example, a data recovery operation may be performed in response to a data recovery command provided from an external device.

Figure 24:
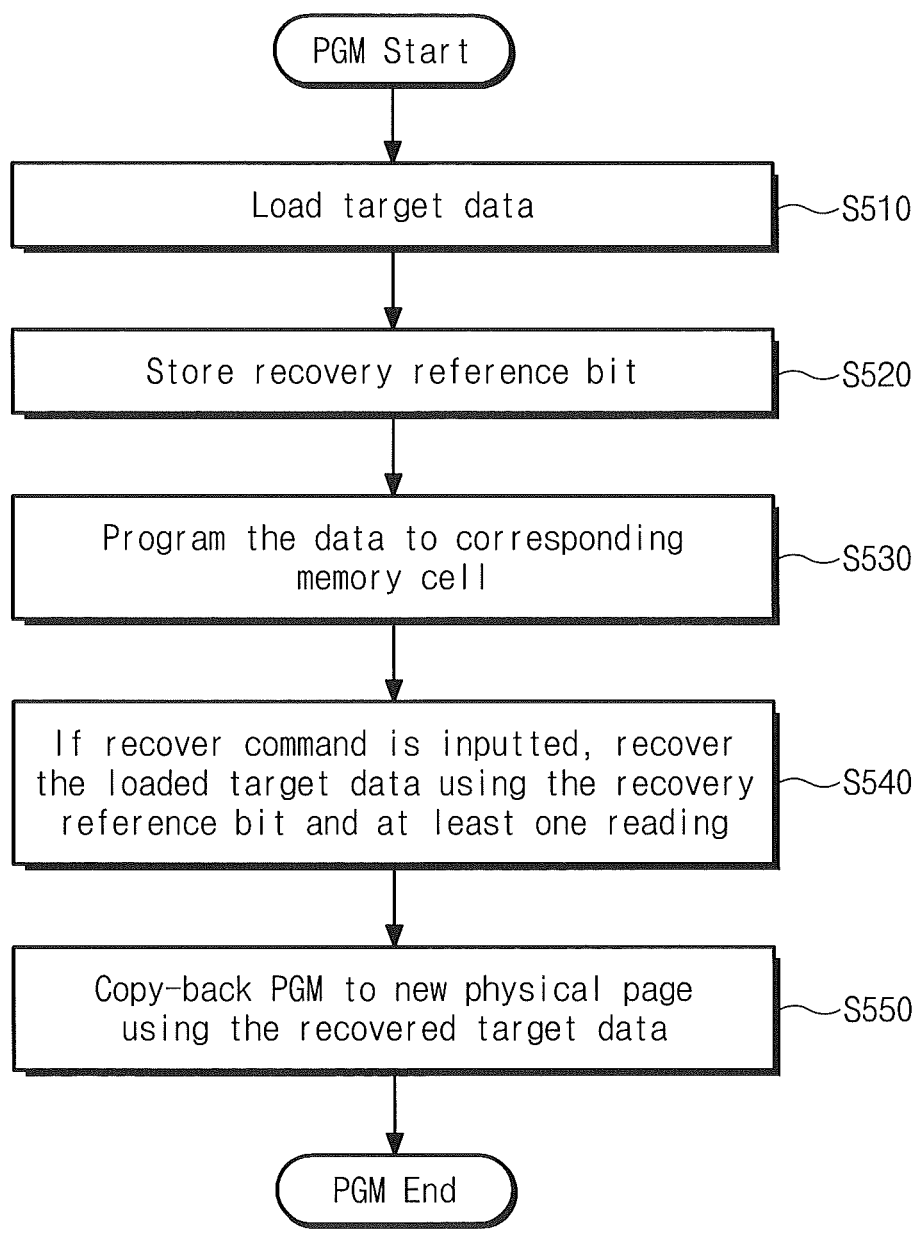
FIG. 24 is a flowchart illustrating a multi-bit program method of a nonvolatile memory device according to still another embodiment of the inventive concept.

FIG. 24 is a flowchart illustrating a multi-bit program method of a nonvolatile memory device according to still another embodiment of the inventive concept. A multi-bit program method of a nonvolatile memory device will be described with reference to FIGS. 1, 13, 17, and 24.

In operation S510, target data TD indicating a target state may be loaded onto a page buffer at a program operation. In operation S520, a recovery reference bit RRB for recovering an upper tail fail bit of an erase state E may be stored at a bit line forcing latch FL. The recovery reference bit RRB may be a bit line forcing bit BFB indicating whether bit line forcing is performed or not.

In operation S530, the target data TD may be programmed at a memory cell. A data recovery operation may be executed in response to a data recovery command provided from a memory controller regardless of whether a program operation is failed. If the data recovery command is received, in operation S540, the loaded target data TD may be recovered using at least one read operation and the recovery reference bit RRB. After the data recovery operation is ended, in operation S550, the recovered target data may be copied back to a new physical page. Afterwards, the program operation may be ended. With the multi-bit program method of the inventive concept, target data may be recovered using a recovery reference bit RRB and at least one read operation when a data recovery command is received.

Figure 25:
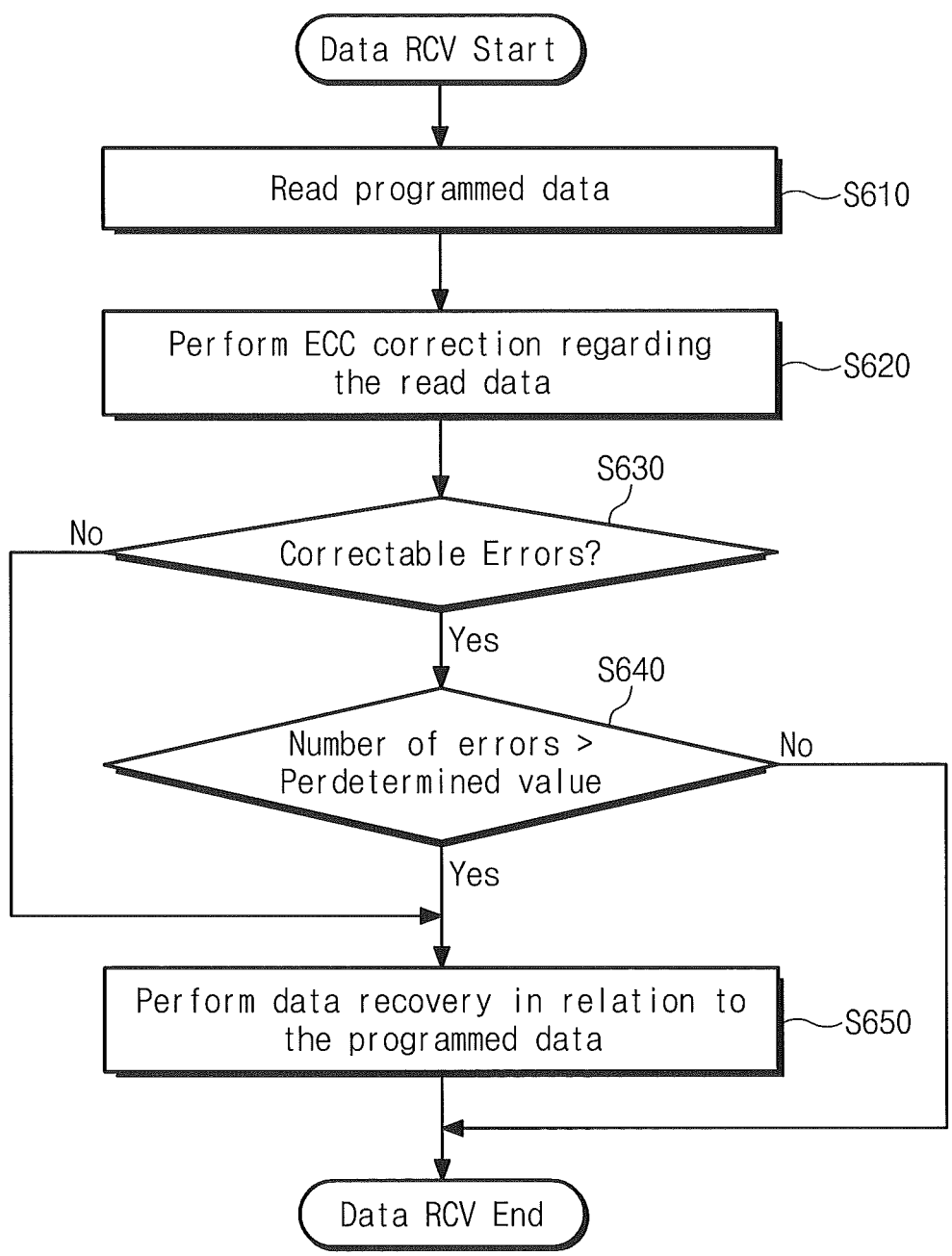
FIG. 25 is a flowchart illustrating a data recovery operation of a memory system according to an embodiment of the inventive concept.

FIG. 25 is a flowchart illustrating a data recovery operation of a memory system according to an embodiment of the inventive concept. Below, a data recovery operation of a memory system will be described with reference to FIG. 25. Herein, a memory system may include at least one nonvolatile memory device and a memory controller controlling the at least one nonvolatile memory device.

In operation S610, the memory controller may read programmed data from the at least one nonvolatile memory device where a program operation is programmed. In operation S620, the memory controller may correct an error of the read data. In operation S630, the memory controller may judge whether an error of the read data is correctable. If an error of the read data is uncorrectable, the method proceeds to operation S650, in which a data recovery operation for recovering programmed data is performed. Herein, the data recovery operation may be performed in a manner which is described with reference to FIGS. 1 to 24. If an error of the read data is correctable, in operation S640, the memory controller may judge whether an erroneous bit number is over a predetermined value. If so, the method proceeds to operation 5650 to secure data reliability. If not, the data recovery operation may be ended. As described above, a data recovery operation may be determined based on an error of read data.

Figure 26:
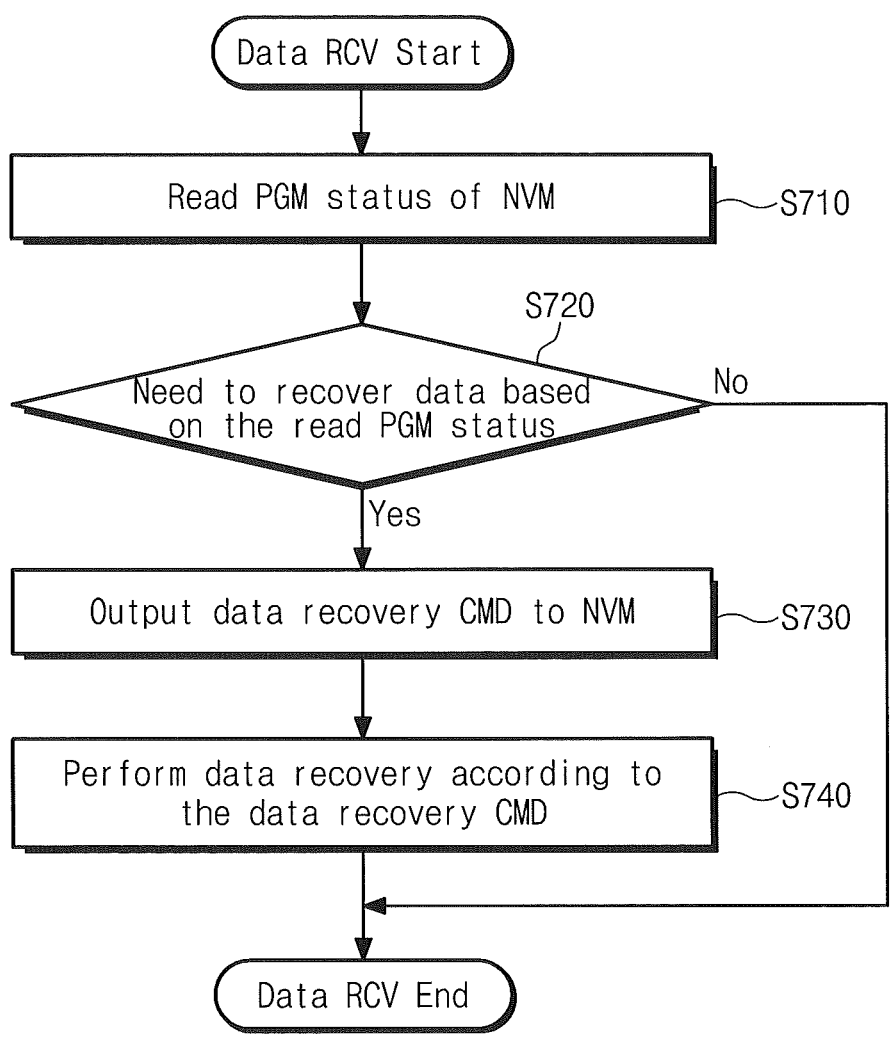
FIG. 26 is a flowchart illustrating a data recovery operation of a memory system according to another embodiment of the inventive concept.

FIG. 26 is a flowchart illustrating a data recovery operation of a memory system according to another embodiment of the inventive concept. Below, a data recovery operation of a memory system will be described with reference to FIG. 26. In operation S710, a memory controller may read program status information indicating a status of a program operation of at least one nonvolatile memory device. In operation S720, the memory controller may judge whether a data recovery operation is needed, based on the read program status information. For example, when a program status indicates total program fail, a data recovery operation may be needed. In this case, in operation S730, the memory controller may output a data recovery command to the nonvolatile memory device. In operation S740, the nonvolatile memory device may perform a data recovery operation in response to the data recovery command. The data recovery operation may be performed in a manner which is described with reference to FIGS. 1 to 24. As described above, a data recovery operation may be determined using program status information of a nonvolatile memory device.

Figure 27:
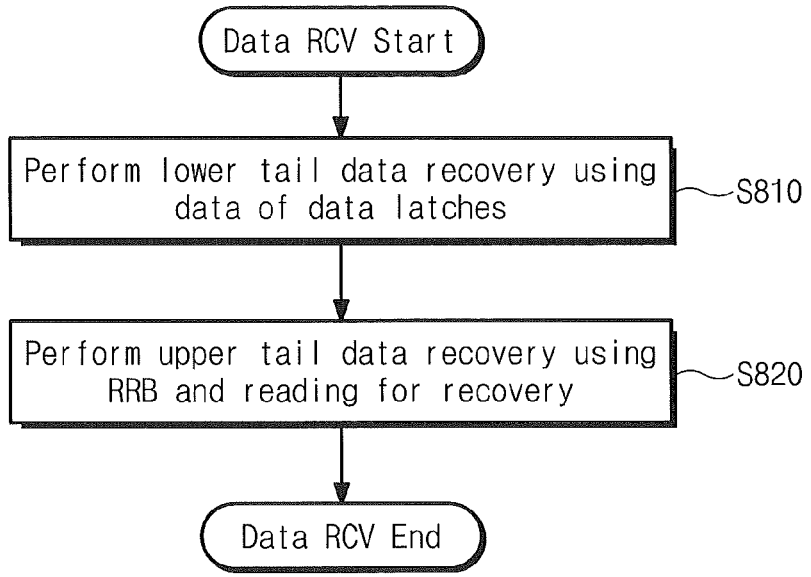
FIG. 27 is a flowchart illustrating a data recovery operation of a memory system according to still another embodiment of the inventive concept.

FIG. 27 is a flowchart illustrating a data recovery operation of a memory system according to still another embodiment of the inventive concept. Below, a data recovery operation of a memory system will be described with reference to FIG. 27. A nonvolatile memory device may perform a lower tail data recovery operation using data of data latches DL1 to DLk (refer to FIG. 2). A lower tail may be a portion where a cell program operation is failed, as described with reference to FIG. 3. In operation S810, the data latches DL1 to DLk may maintain data of a target state when a cell program operation is failed. Also, the nonvolatile memory device may perform an upper tail data recovery operation using a recovery reference bit RRB or at least one read operation for data recovery. An upper tail may be a portion where a cell program operation is passed, as described with reference to FIG. 5. As described with reference to FIGS. 5 and 6, the nonvolatile memory device may recover target data TD indicating a target state using a recovery reference bit RRB and a read operation. A data recovery operation of the inventive concept may perform a lower tail/upper tail data recovery operation.

Figure 28:
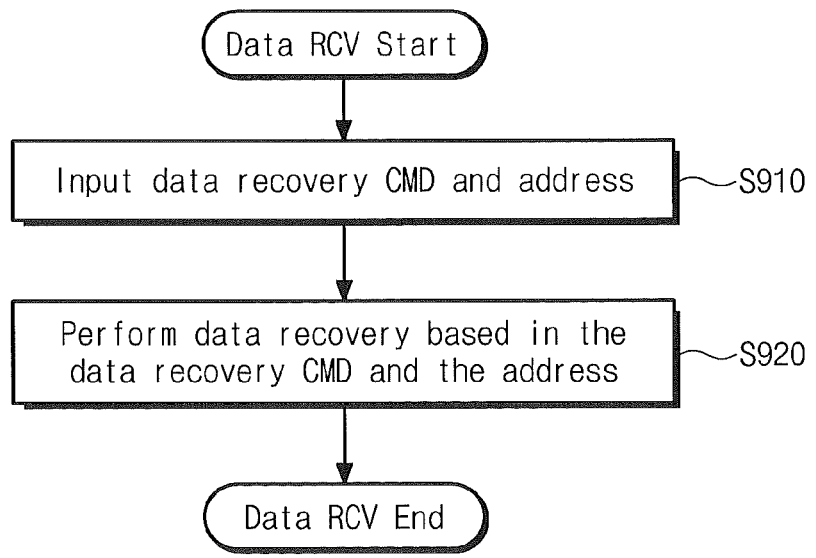
FIG. 28 is a flowchart illustrating a data recovery operation of a memory system according to still another embodiment of the inventive concept.

FIG. 28 is a flowchart illustrating a data recovery operation of a memory system according to still another embodiment of the inventive concept. Below, a data recovery operation of a memory system will be described with reference to FIG. 28. In operation S910, a nonvolatile memory device may receive a data recovery command and an address from a memory controller. The address may direct a new page where recovered data is programmed. In operation S920, the nonvolatile memory device may perform a data recovery operation in response to the input data recovery command and address. The data recovery operation may be performed in a manner which is described with reference to FIGS. 1 to 24. As described above, target data may be recovered according to a data recovery command, and recovered data may be programmed at a new page appointed by an address.

With the inventive concept, state information (e.g., RRB) associated with a specific state causing relatively many fail bits may be set/stored at a program operation. At a data recovery operation, target data corresponding to the specific state may be recovered using the state information.

The inventive concept is applicable to a vertical NAND flash memory device.

Figure 29:
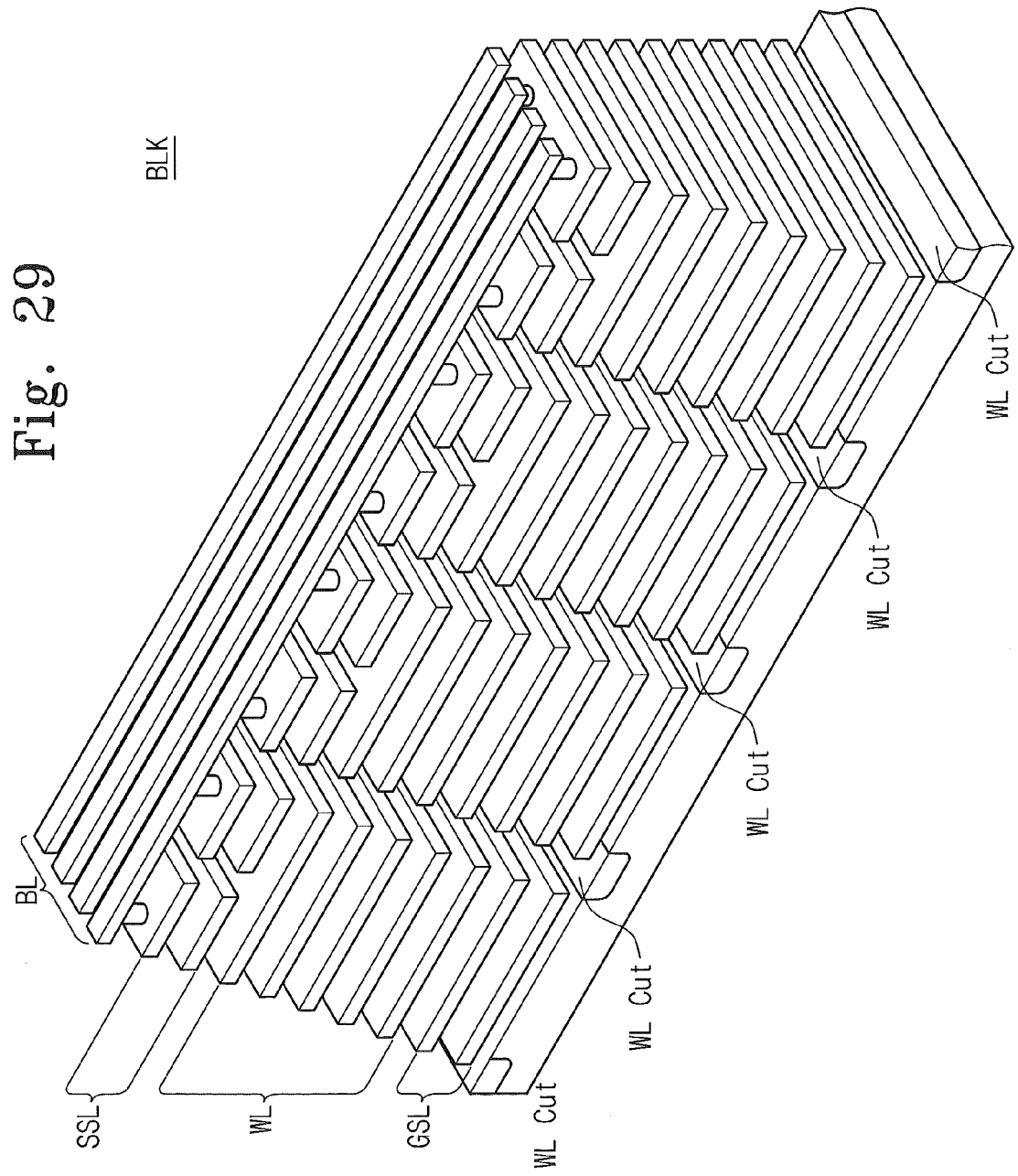
FIG. 29 is a perspective view of a memory block according to the inventive concept.

FIG. 29 is a perspective view of a memory block according to the inventive concept. Referring to FIG. 29, at least one ground selection line GSL, a plurality of word lines WL, and at least one string selection line SSL may be stacked on a substrate between word line cuts. Herein, the at least one string selection line SSL may be separated by a string selection line cut. A plurality of pillars may penetrate at least one ground selection line GSL, a plurality of word lines WL, and at least one string selection line SSL. Herein, at least one ground selection line GSL, a plurality of word lines WL, and at least one string selection line SSL may be formed to have a substrate shape. Bit lines BL may be connected to an upper surface of the plurality of pillars. The memory block in FIG. 29 may have a word line merged structure. However, the inventive concept is not limited thereto.

Figure 30:
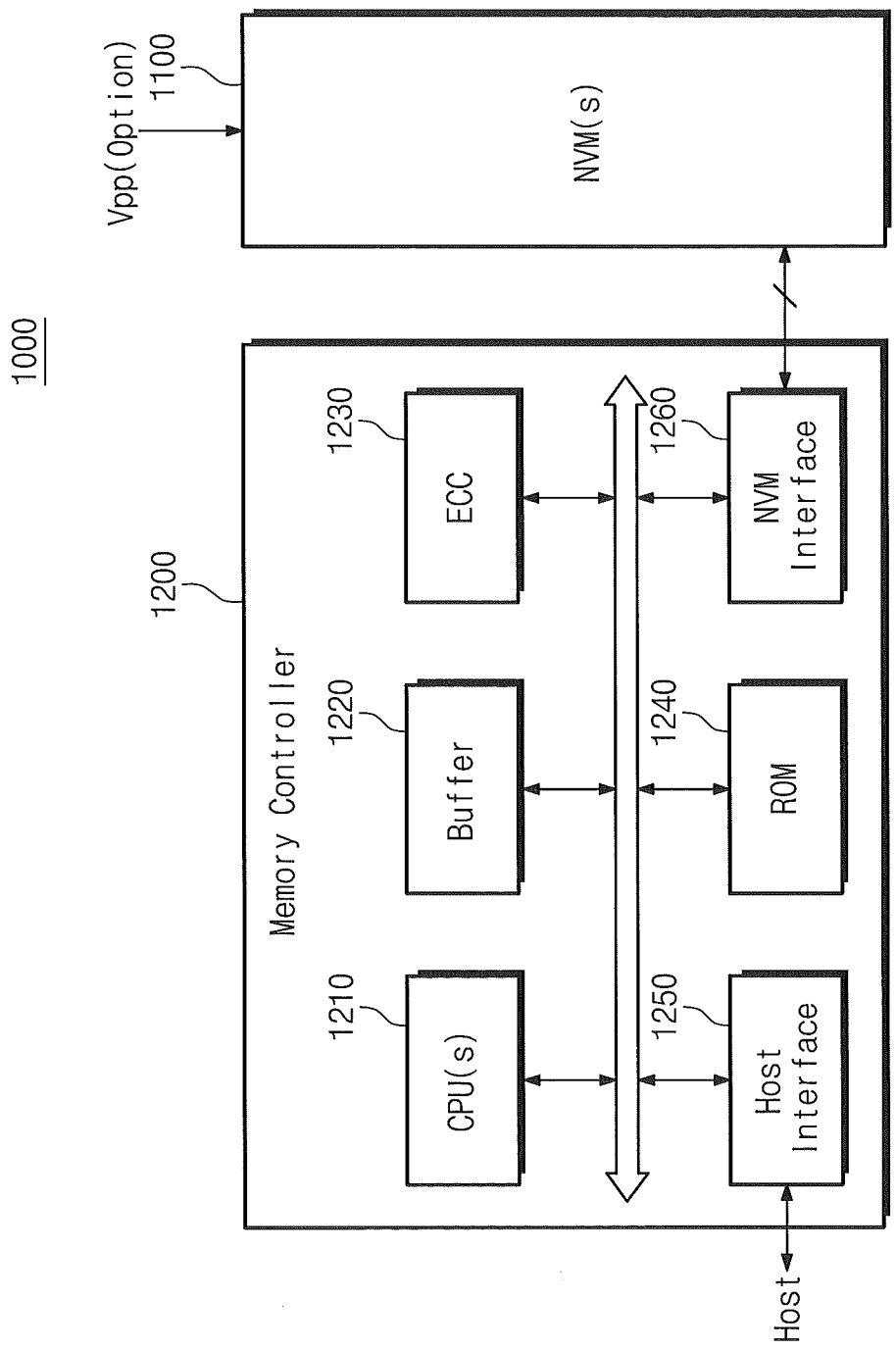
FIG. 30 is a block diagram schematically illustrating a memory system according to an embodiment of the inventive concept.

FIG. 30 is a block diagram schematically illustrating a memory system according to an embodiment of the inventive concept. Referring to FIG. 30, a memory system 1000 may include at least one nonvolatile memory device 1100 and a memory controller 1200. The nonvolatile memory device 1100 may be configured to perform a data recovery operation described with reference to FIGS. 1 to 28.

The nonvolatile memory device 1100 may be optionally supplied with a high voltage Vpp from the outside. The memory controller 1200 may be connected with the nonvolatile memory device 1100 via a plurality of channels. The memory controller 1200 may include at least one Central Processing Unit (CPU) 1210, a buffer memory 1220, an ECC circuit 1230, a ROM 1240, a host interface 1250, and a memory interface 1260. Although not shown in FIG. 30, the memory controller 1200 may further comprise a randomization circuit that randomizes and de-randomizes data. The memory system 1000 according to an embodiment of the inventive concept is applicable to a perfect page new (PPN) memory.

The memory controller 1200 may generate a data recovery command when a program operation of the nonvolatile memory device 1100 is failed or when the reliability of a program operation is required, and may provide the data recovery command to the nonvolatile memory device 1100.

The memory controller 1200 may include the ECC circuit 1230 which is configured to an error of data according to an error correction code (ECC). The ECC circuit 1230 may calculate an error correction code value of data to be programmed at a write operation, correct an error of data read at a read operation based on the error correction code value, and correct an error of recovered data from the nonvolatile memory device 1100 at a data recovery operation. The memory controller 1200 may provide the nonvolatile memory device 1100 with a program command such that data recovered at a data recovery operation is programmed at another physical page.

The memory system 1000 may improve data reliability by recovering target data at a data recovery operation. Also, the memory system 1000 may reduce a chip size since it does not necessitate a separate storage space for storing target data for a data recovery operation.

Figure 31:
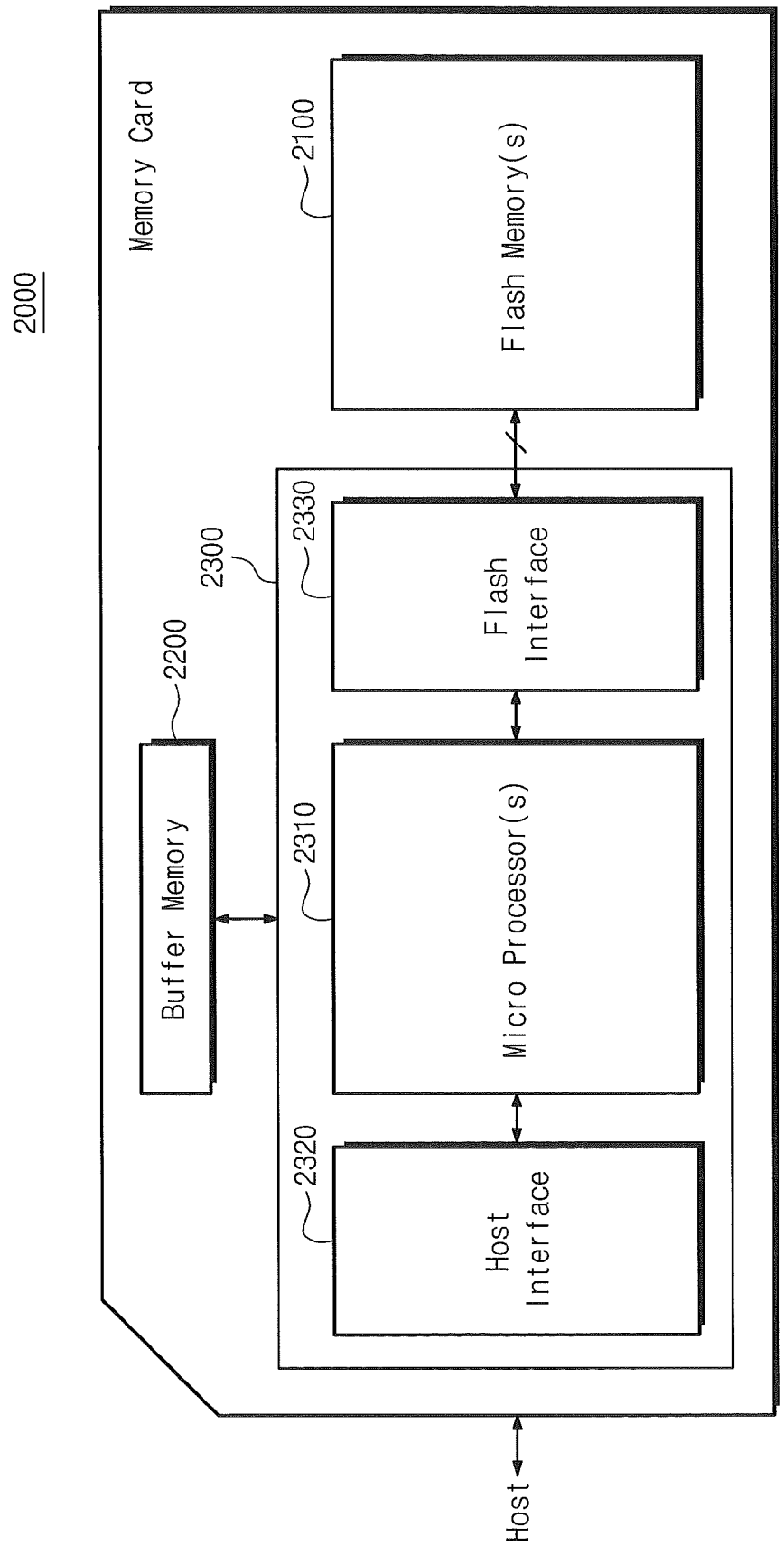
FIG. 31 is a block diagram schematically illustrating a memory card according to an embodiment of the inventive concept.

FIG. 31 is a block diagram schematically illustrating a memory card according to an embodiment of the inventive concept. Referring to FIG. 31, a memory card 2000 may include at least one flash memory 2100, a buffer memory device 2200, and a memory controller 2300 for controlling the flash memory 2100 and the buffer memory device 2200.

The flash memory 2100 may be optionally supplied with a high voltage Vpp from the outside. The flash memory 2100 may be configured to perform a data recovery operation described in FIGS. 1 to 28. The buffer memory device 2200 may be used to temporarily store data generated during the operation of the memory card 2000. The buffer memory device 2200 may be implemented using a DRAM or an SRAM. The memory controller 2300 may be connected with the flash memory 2100 via a plurality of channels. The memory controller 2300 may be connected between a host and the flash memory 2100. The memory controller 2300 may be configured to access the flash memory 2100 in response to a request from the host.

The memory controller 2300 may include at least one microprocessor 2310, a host interface 2320, and a flash interface 2330. The microprocessor 2310 may be configured to drive firmware. The host interface 2320 may interface with the host via a card protocol (e.g., SD/MMC) for data exchanges between the host and the memory card 2000.

The memory card 2000 is applicable to Multimedia Cards (MMCs), Security Digitals (SDs), miniSDs, memory sticks, smart media, Trans-flash cards, and the like.

Figure 32:
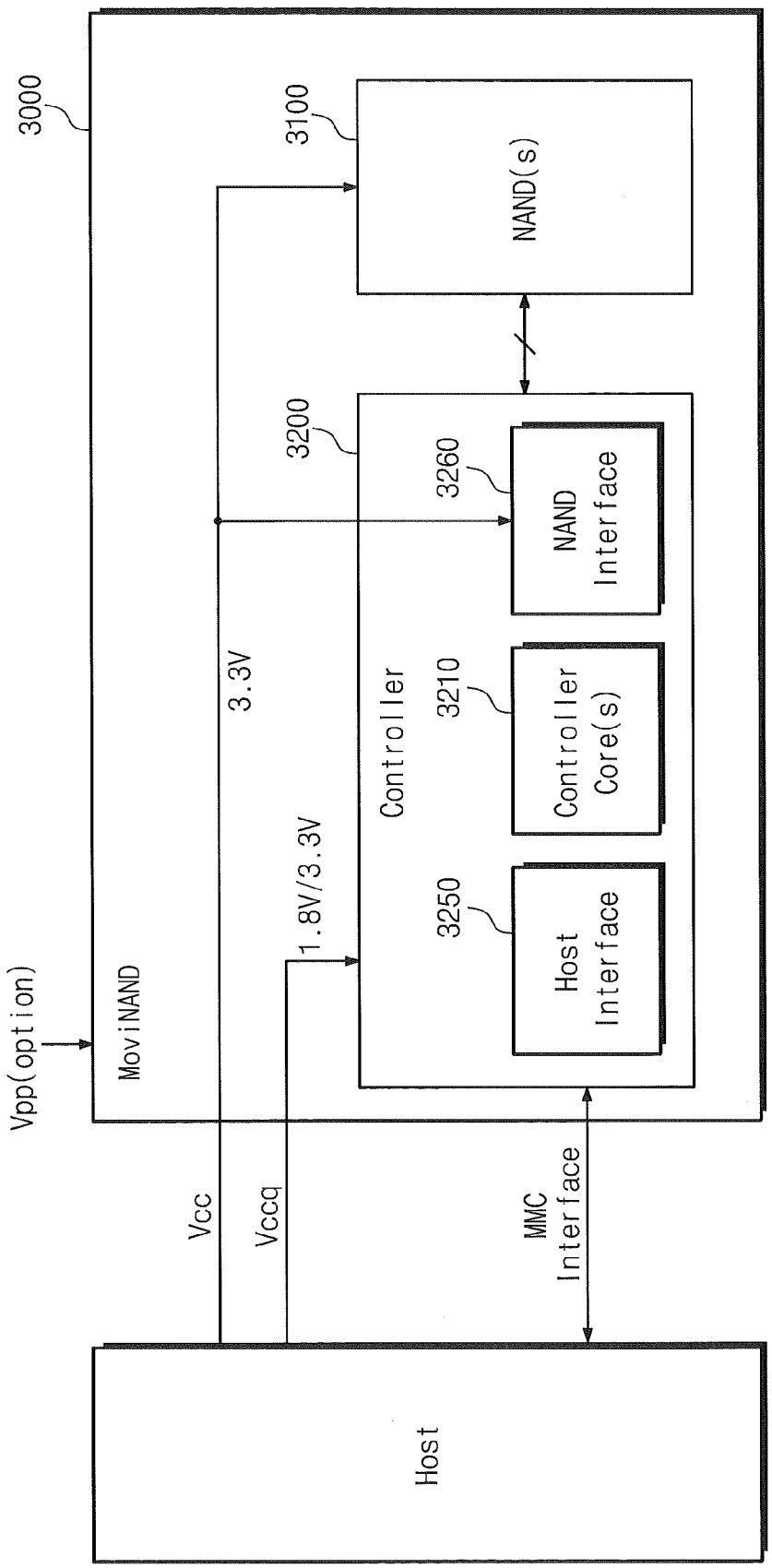
FIG. 32 is a block diagram schematically illustrating a moviNAND according to an embodiment of the inventive concept.

FIG. 32 is a block diagram schematically illustrating a moviNAND according to an embodiment of the inventive concept. Referring to FIG. 32, a moviNAND device 3000 may include at least one NAND flash memory device 3100 and a controller 3200. The moviNAND device 3000 may support the MMC 4.4 (or, referred to as "eMMC") standard.

The NAND flash memory device 3100 may be a single data rate (SDR) NAND flash memory device or a double data rate (DDR) NAND flash memory device. In example embodiments, the NAND flash memory device 3100 may include NAND flash memory chips. Herein, the NAND flash memory device 3100 may be implemented by stacking the NAND flash memory chips at one package (e.g., FBGA, Fine-pitch Ball Grid Array, etc.). Each NAND flash memory chip may be configured to perform a data recovery operation described in FIGS. 1 to 24.

The controller 3200 may be connected with the flash memory device 3100 via a plurality of channels. The controller 3200 may include at least one controller core 3210, a host interface 3250, and a NAND interface 3260. The controller core 3210 may control an overall operation of the moviNAND device 3000. The host interface 3250 may be configured to perform an MMC interface between the controller 3210 and a host. The NAND interface 3260 may be configured to interface between the NAND flash memory device 3100 and the controller 3200. In example embodiments, the host interface 3250 may be a parallel interface (e.g., an MMC interface). In other example embodiments, the host interface 3250 of the moviNAND device 3000 may be a serial interface (e.g., UHS-II, UFS, etc.).

The moviNAND device 3000 may receive power supply voltages Vcc and Vccq from the host. Herein, the power supply voltage Vcc (about 3.3V) may be supplied to the NAND flash memory device 3100 and the NAND interface 3260, while the power supply voltage Vccq (about 1.8V/3.3V) may be supplied to the controller 3200. In example embodiments, an external high voltage Vpp may be optionally supplied to the moviNAND device 3000.

The moviNAND device 3000 according to an embodiment of the inventive concept may be advantageous to store mass data as well as may have an improved read characteristic. The moviNAND device 3000 according to an embodiment of the inventive concept is applicable to small and low-power mobile products (e.g., a Galaxy S, iPhone, etc.).

Figure 33:
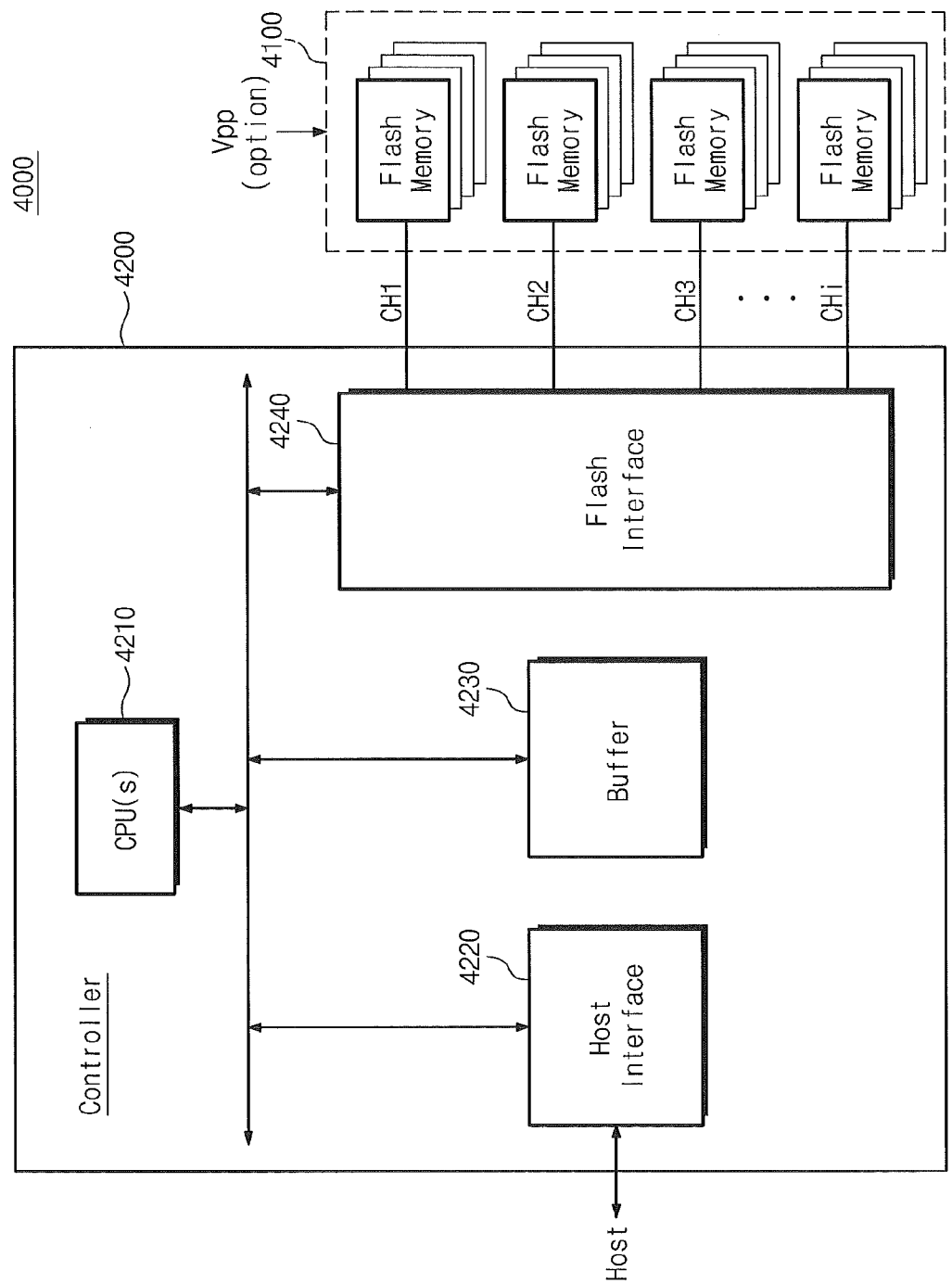
FIG. 33 is a block diagram schematically illustrating a solid state drive according to an embodiment of the inventive concept.

FIG. 33 is a block diagram schematically illustrating a solid state drive according to an embodiment of the inventive concept. Referring to FIG. 33, a solid state drive (SSD) 4000 may include a plurality of flash memory devices 4100 and an SSD controller 4200. The flash memory devices 4100 may be optionally supplied with a high voltage Vpp from the outside. The flash memory devices 4100 may be configured to perform a data recovery operation described with reference to FIGS. 1 to 28. The SSD controller 4200 may be connected to the flash memory devices 4100 via a plurality of channels CH1 to CHi. The SSD controller 4200 may include at least one CPU 4210, a host interface 4220, a buffer memory 4230, and a flash interface 4240.

The SSD 400 according to an embodiment of the inventive concept may perform a program operation capable of improving the reliability of data. More detailed description of the SSD 4000 is disclosed in U.S. Pat. Nos. 7,802,054, 8,027,194, and 8,122,193 and U.S. Patent Publication Nos. 2007/0106836 and 2010/0082890, the entire contents of which are herein incorporated by references.

Figure 34:
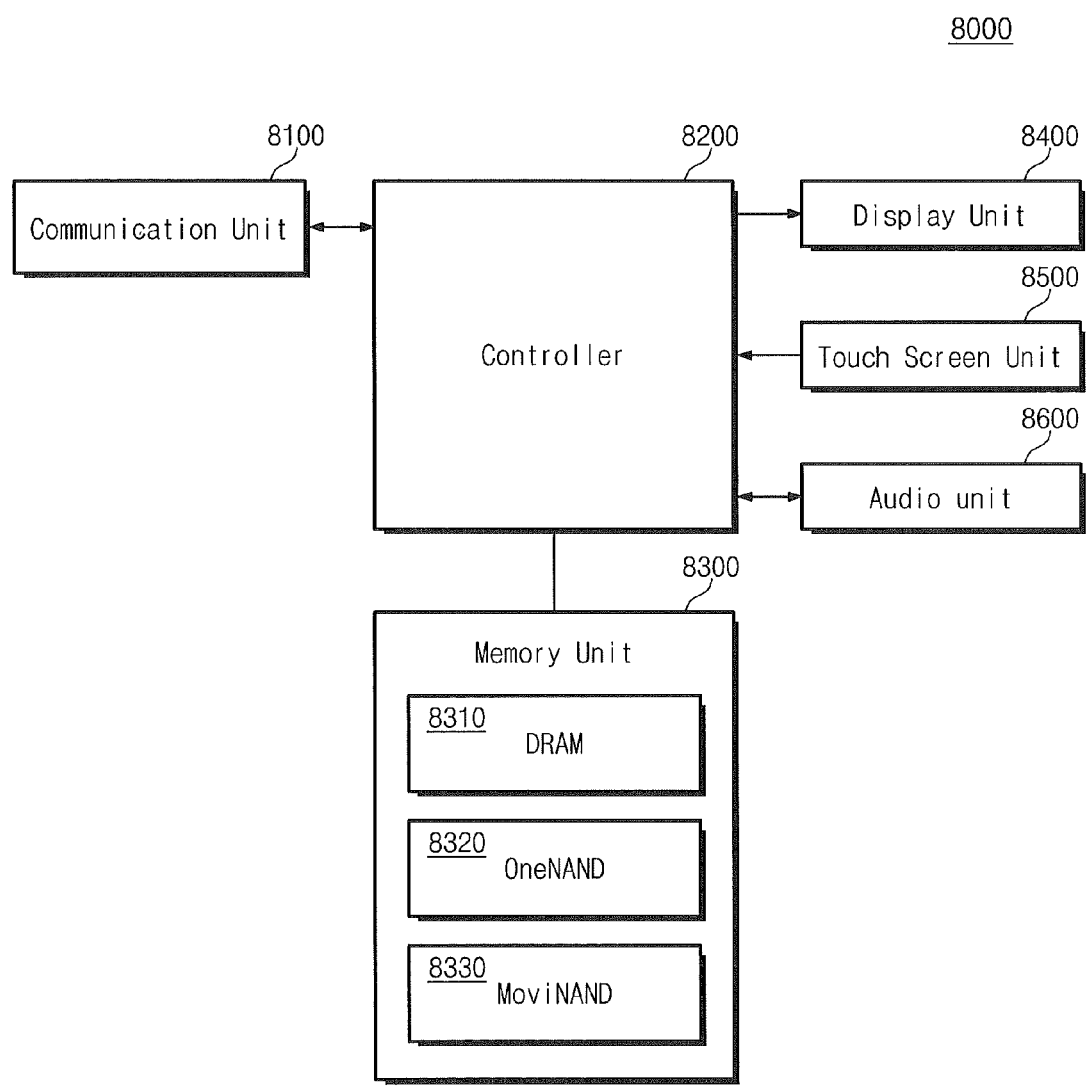
FIG. 34 is a block diagram schematically illustrating a communication device according to an embodiment of the inventive concept.

FIG. 34 is a block diagram schematically illustrating a communication device according to an embodiment of the inventive concept. Referring to FIG. 34, a communication device 8000 may include a communication unit 8100, a controller 8200, a memory unit 8300, a display unit 8400, a touch screen unit 8500, and an audio unit 8600.

The memory unit 8300 may include at least one DRAM 8310, at least one OneNAND 8320, and at least one moviNAND 8330. At least one of the OneNAND 8320 and the MoviNAND 8330 may be configured to be the same as a memory system 2700 in FIG. 27. Detailed description of typical mobile devices are disclosed in U.S. Patent Publication Nos. 2010/0010040, 2010/0062715, 2010/00199081, 2010/0309237 and 2010/0315325, the entire contents of which are herein incorporated by references.

Figure 35:
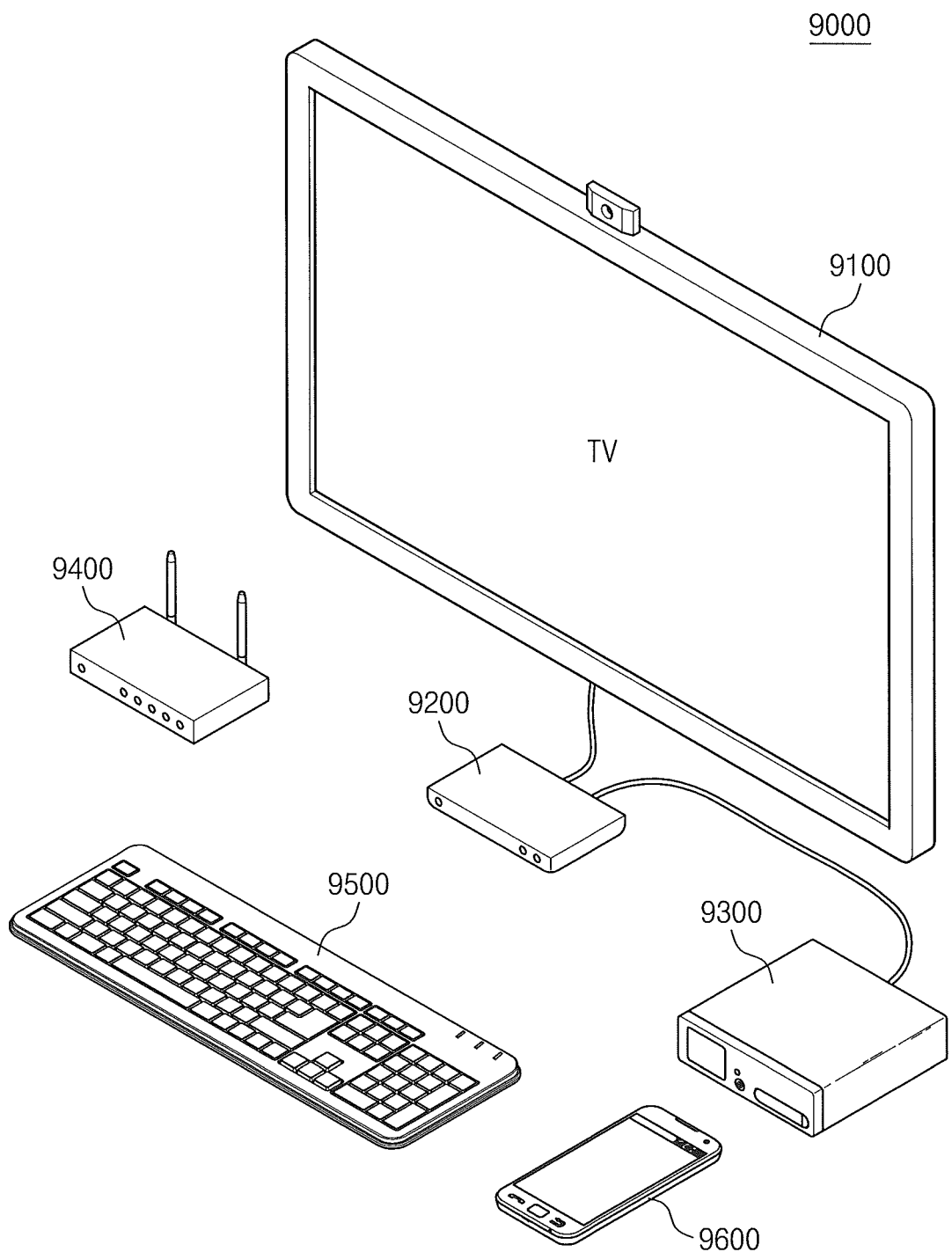
FIG. 35 is a block diagram schematically illustrating a smart TV system according to an embodiment of the inventive concept.

FIG. 35 is a block diagram schematically illustrating a smart TV system according to an embodiment of the inventive concept. Referring to FIG. 35, a smart TV system 9000 may include a smart TV 9100, a revue 9200, a set-top box 9300, a wireless router 9400, a keypad 9500, and a smart phone 9600. Wireless communication may be performed between the smart TV 9100 and the wireless router 9400. The smart TV 9100 may be connected with an internet through the revue 9200 being an open platform. The smart TV 9100 may enable a user to view cable and satellite broadcasting transferred through the set-top box 9300. The smart TV 9100 may be operated according to the control of the keypad 9500 or the smart phone 9600. The smart TV 9100 may include a memory system 1000 illustrated in FIG. 30.

A memory system or a storage device according to the inventive concept may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a nonvolatile memory device, comprising:
    detecting errors generated during an operation to program a portion of a first plurality of multi-bit nonvolatile memory cells in the nonvolatile memory device by reading the first plurality of multi-bit nonvolatile memory cells and bit line forcing bit (BFB) data verified during the program operation to identify whether any of the first plurality of multi-bit nonvolatile memory cells contain erroneous data.

2. The method of claim 1, wherein said detecting errors further comprises reading data from a page buffer associated with the first plurality of multi-bit nonvolatile memory cells to identify which of the first plurality of multi-bit nonvolatile memory cells are erased cells having excessively high threshold voltages.

3. The method of claim 1, wherein the program operation comprises verifying first bit line forcing bit (BFB) data having equivalent first data values therein, and wherein the verifying comprises modifying at least some of the first BFB data to thereby define second BFB data having a plurality of second data values therein that identify respective ones of the first plurality of multi-bit nonvolatile memory cells that have undergone at least partial programming during the program operation.

4. A method of operating a nonvolatile memory device, comprising:
    detecting errors generated during an operation to program a selected page of multi-bit nonvolatile memory cells in the nonvolatile memory device by evaluating: (i) data read from the selected page of multi-bit nonvolatile memory cells, (ii) bit line forcing bit (BFB) data modified during the program operation and (iii) data in a page buffer associated with the page of multi-bit nonvolatile memory cells, to identify whether any of the multi-bit nonvolatile memory cells in the selected page are erased cells having substantially high threshold voltages.

5. The method of claim 4, wherein the program operation comprises modifying initial BFB data having all equivalent first data values therein into updated BFB data having a plurality of second data values therein that identify a respective plurality of the multi-bit nonvolatile memory cells in the selected page as having undergone at least partial intentional programming during the program operation.

6. The method of claim 5, wherein the program operation further comprises resetting at least some of the data in the page buffer to default values in response to successfully programming of one or more of the multi-bit nonvolatile memory cells in the selected page during the program operation.

7. A method of operating a nonvolatile memory device, comprising:
changing a first multi-bit data value associated with a first program state of a first multi-bit nonvolatile memory cell in the nonvolatile memory device to a second multi-bit data value associated with an erased state of the first multi-bit nonvolatile memory cell, in response to verifying that the first multi-bit nonvolatile memory cell has been validity programmed into the first program state during a program operation; and
reading bit line forcing bit (BFB) data modified during the program operation to confirm that the second multi-bit data value associated with the first multi-bit nonvolatile memory cell reflects an accurately programmed cell.

8. The method of claim 7, wherein the program operation comprises resetting the first multi-bit data value to the second multi-bit data value in a page buffer.

9. The method of claim 8, wherein said reading comprises reading the page buffer, the BFB data modified during the program operation and a plurality of multi-bit nonvolatile memory cells in the nonvolatile memory device to identify erased cells in the plurality of multi-bit nonvolatile memory cells having unacceptably high threshold voltages.

10. The method of claim 7, wherein said reading BFB data modified during the program operation is preceded by loading a plurality of BFB data bits having equivalent logic values into a BFB data register.

11. The method of claim 10, further comprising modifying at least a portion of the BFB data in the BFB data register during the program operation to identify a plurality of multi-bit nonvolatile memory cells in the nonvolatile memory device that have undergone intentional programming using an ISSP programming technique.

12. A method of operating a nonvolatile memory device, comprising:
performing an error detection operation on a row of multi-bit nonvolatile memory cells in the nonvolatile memory device by reading the row of multi-bit nonvolatile memory cells along with reading post-program data from a page buffer and bit line forcing bit (BFB) data used during programming of the row of multi-bit nonvolatile memory cells, to thereby identify whether any of the multi-bit nonvolatile memory cells in the row are erased cells having unacceptably high threshold voltages.

13. The method of claim 12, wherein said performing is preceded by:
loading a plurality of pages of data to the page buffer; and
programming the row of multi-bit nonvolatile memory cells with the plurality of pages of data from the page buffer.

14. The method of claim 13, wherein said programming the row of multi-bit nonvolatile memory cells comprises resetting at least some of the data in the page buffer as corresponding program states of multi-bit nonvolatile memory cells in the row are verified as accurate.

15. The method of claim 14, wherein said programming the row of multi-bit nonvolatile memory cells comprises modifying bits of pre-loaded bit line forcing bit (BFB) data to thereby indicate which multi-bit nonvolatile memory cells in the row have been intentionally programmed.

16. The method of claim 14, wherein said programming the row of multi-bit nonvolatile memory cells comprises modifying bits of pre-loaded bit line forcing bit (BFB) data to thereby indicate the performance of ISSP program operations on corresponding multi-bit nonvolatile memory cells within the row.

17. An integrated circuit memory system, comprising:
at least one nonvolatile memory device; and
a memory controller electrically coupled to said at least one nonvolatile memory device, said memory controller comprising a central processing circuit and an ECC circuit therein, said ECC circuit configured to perform a data recovery operation on data programmed into said at least one nonvolatile memory device during a program operation by reading a first plurality of multi-bit nonvolatile memory cells in said at least one nonvolatile memory device and a plurality of bit line forcing bits modified during the program operation to identify whether any of the first plurality of multi-bit nonvolatile memory cells contain erroneous data.

18. The memory system of claim 17, wherein said data recovery operation comprises reading data from a page buffer associated with the first plurality of multi-bit nonvolatile memory cells to identify which of the first plurality of multi-bit nonvolatile memory cells are erased cells having excessively high threshold voltages.

19. The memory system of claim 18, wherein the program operation comprises:
modifying bit line forcing bit (BFB) data having equivalent first data values therein into modified BFB data having a plurality of second data values therein that identify respective ones of the first plurality of multi-bit nonvolatile memory cells that have undergone at least partial intentional programming during the program operation; and
updating data in the page buffer in response to successful programming of one or more of the first plurality of multi-bit nonvolatile memory cells during the program operation.

20. The memory system of claim 17, wherein the program operation comprises modifying bit line forcing bit (BFB) data having equivalent first data values therein into modified BFB data having a plurality of second data values therein that identify respective ones of the first plurality of multi-bit nonvolatile memory cells that have undergone at least partial intentional programming during the program operation.

21. A method of operating a nonvolatile memory device, comprising:
loading a forcing bit latch (FL) in the nonvolatile memory device with initial bit line forcing bit (BFB) data having equivalent first BFB logic values;
programming at least some of a first plurality of multi-bit nonvolatile memory cells in the nonvolatile memory device with first data during a program operation, which includes modifying at least some of the initial BFB data in the FL to thereby identify which of the first plurality of multi-bit nonvolatile memory cells have been intentionally programmed during the program operation and which of the first plurality of multi-bit nonvolatile memory cells should remain erased upon completion of the program operation; and then verifying the accuracy of the first data programmed during said programming by reading the first data from the first plurality of multi-bit nonvolatile memory cells and the BFB data in the FL, to thereby determine which of the first plurality of multi-bit nonvolatile memory cells that should have remained erased upon completion of the program operation have nonetheless undergone excessive unintentional programming.

* * * * *